US009880030B2

(12) United States Patent
Graf et al.

(10) Patent No.: US 9,880,030 B2
(45) Date of Patent: Jan. 30, 2018

(54) EXTENDING PROGRAMMABLE MEASUREMENT DEVICE FUNCTIONALITY

(71) Applicant: NATIONAL INSTRUMENTS CORPORATION, Austin, TX (US)

(72) Inventors: Christopher F. Graf, Liberty Hill, TX (US); Ryan P. Verret, Austin, TX (US); Joseph H. DiGiovanni, Austin, TX (US); Dustyn K. Blasig, Pflugerville, TX (US); Jeronimo Mota, Austin, TX (US); Kunal H. Patel, Houston, TX (US); Duncan G. Hudson, III, Cedar Park, TX (US); Brian K. Odom, Georgetown, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 856 days.

(21) Appl. No.: 14/295,443

(22) Filed: Jun. 4, 2014

(65) Prior Publication Data

US 2014/0358469 A1 Dec. 4, 2014

Related U.S. Application Data

(60) Provisional application No. 61/858,990, filed on Jul. 26, 2013.

(51) Int. Cl.
G06F 9/44 (2006.01)
G01D 11/00 (2006.01)
G06F 17/50 (2006.01)
G06F 11/273 (2006.01)

(52) U.S. Cl.
CPC ............ G01D 11/00 (2013.01); G06F 9/4411 (2013.01); G06F 11/273 (2013.01); G06F 17/5054 (2013.01)

(58) Field of Classification Search
None
See application file for complete search history.

(56) References Cited

U.S. PATENT DOCUMENTS

| 7,568,172 B2 | 7/2009 | Breyer | |
| 2006/0015862 A1 | 1/2006 | Odom | |
| 2012/0054511 A1* | 3/2012 | Brinks | G06F 1/26 713/310 |

* cited by examiner

Primary Examiner — Chuck Kendall
(74) Attorney, Agent, or Firm — Meyertons Hood Kivlin Kowert & Goetzel, P.C.

(57) ABSTRACT

System and method for extending programmable device functionality while preserving functionality of the device driver and driver IP. User input may be received specifying functionality of custom IP for a programmable measurement device with standard driver IP. The custom IP may be generated accordingly, and may be deployable to the programmable measurement device. During operation the custom IP may communicate directly with the standard driver IP and may provide custom functionality of the programmable measurement device while preserving functionality of the standard driver IP on the programmable measurement device and the standard device driver.

20 Claims, 28 Drawing Sheets

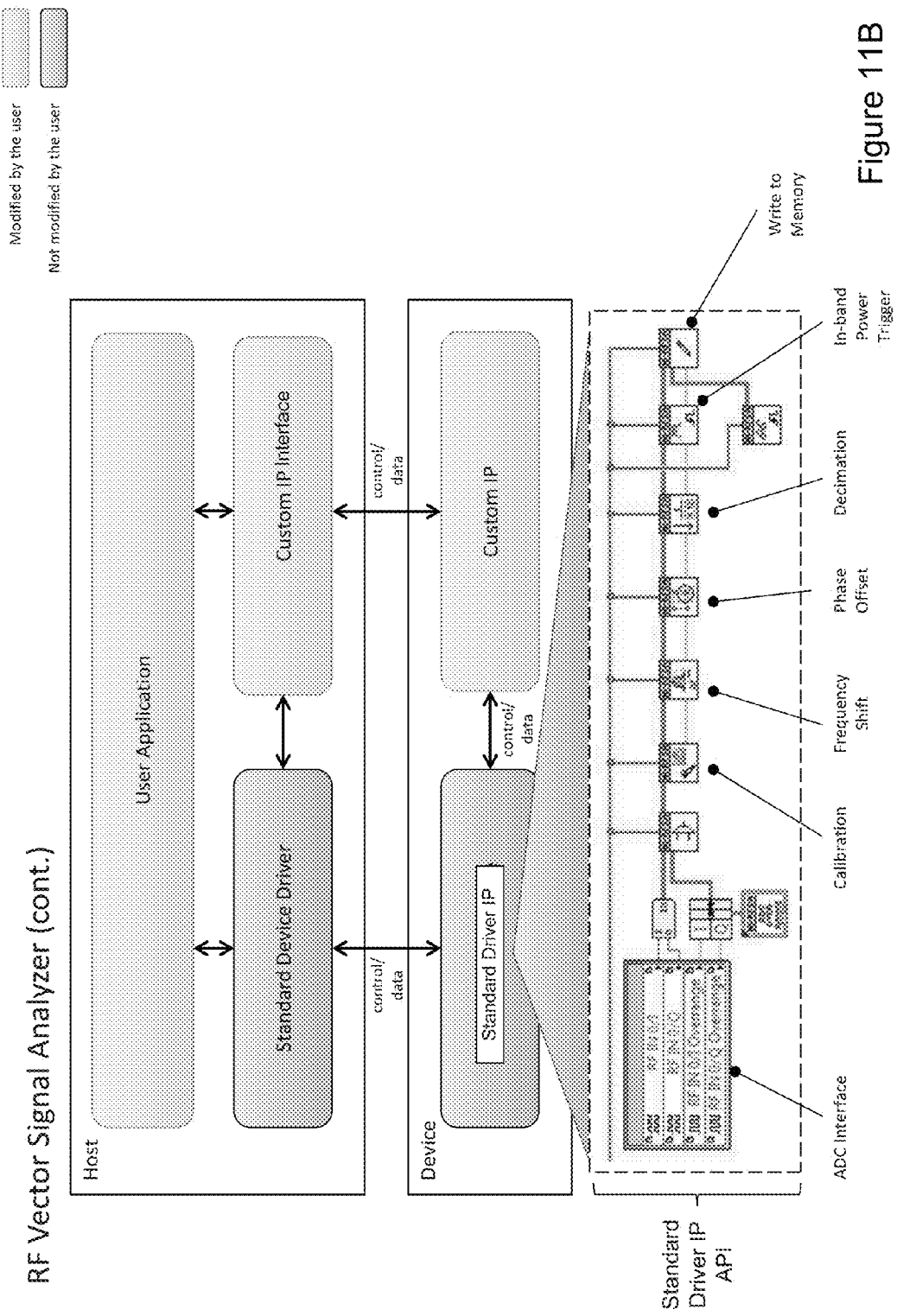

EXTENDING PROGRAMMABLE MEASUREMENT DEVICE FUNCTIONALITY

PRIORITY DATA

This application claims benefit of priority to U.S. Provisional Application Ser. No. 61/858,990, titled "Extending Programmable Device Functionality", filed Jul. 26, 2013, whose inventors were Christopher F. Graf, Ryan P. Verret, Joseph H. DiGiovanni, David E. Klipec, Dustyn Keith Blasig, Jeronimo Mota, Kunal H. Patel, Duncan G. Hudson III, and Brian Keith Odom, and which is hereby incorporated by reference in its entirety as though fully and completely set forth herein.

FIELD OF THE INVENTION

The present invention relates to the field of device customization, and more particularly to a system and method for extending programmable measurement device functionality while preserving the functionality of the device driver and driver IP (intellectual property core or block).

DESCRIPTION OF THE RELATED ART

Programmable hardware, such as field programmable gate arrays, is increasingly used in devices, e.g., industrial devices, instruments, etc., to provide flexibility and customizability by users. Such programmable hardware is typically configured with IP (intellectual property core or block), which in the field of electronic design refers to a reusable unit of logic, cell, or chip layout design owned by an entity, e.g., an IP core or IP block, e.g., which may be used to configure programmable hardware or an application specific integrated circuit (ASIC), and which may also refer to host side code whereby a user's host application communicates with the IP on the programmable hardware.

Prior art FIG. 1 illustrates a typical system with a non-programmable device, e.g., a non-programmable measurement device (labeled "Device"), where a host device, e.g., a host computer system, (labeled "Host") is communicatively coupled to a device. As shown, the host computer system includes a user application, which may be modified by a user, and a standard device driver, e.g., provided by a vendor of the standard device driver (which may or may not be the vendor or manufacturer of the programmable device), which generally may not be modified by the user. The device includes "standard driver IP", which also may be provided by the vendor (which may or may not be the manufacturer) of the programmable device, and which also may not be modified by the user. As used herein, the term "standard", when used in the context of device drivers and driver IP, refers to a non-user-customized, vendor owned product which has a common interface that is designed to work across multiple versions of the standard driver and driver IP. In this way, the standard driver and driver IP can be maintained and updated independently of custom IP. This is in contrast to user or "custom" drivers, driver IP, or IP.

In other words, such devices generally come with a standard device driver that implements some device-specific functionality. The device driver interacts with the device via some standard driver IP that runs on the device itself. This driver IP implements all of the functionality that is required by the various features of the device driver. The standard device driver and driver IP are typically owned and maintained by the device vendor (although sometimes the standard device driver may be owned by a different vendor than that of the device), which may periodically update the driver, the driver IP, or both, in subsequent driver software releases of the product. Thus, a user typically does not create or maintain such "standard" products. Furthermore, as noted above, this standard driver and driver IP typically has an interface that is designed to work across multiple versions of the standard driver and driver IP. This helps permit the standard driver and driver IP to be maintained and updated independently of custom IP.

The device driver commonly has a programmatic application programming interface (API) that is exposed on the host. The user application may customize the behavior of the device by programming via this driver API. However, the device does not have provisions that allow the user to directly program the driver IP running on the device. In other words, the user cannot add custom code directly on the device itself. This limitation can be a problem for the system designer, in that it can limit the overall performance or features that would otherwise be attainable if the user could directly program the device driver IP.

Standard instrument drivers are available today with programmable behavior, but do not provide users the ability to programmatically alter the device's behavior from the device driver IP itself, while also allowing the user application to directly interact with custom IP (encoded functionality deployable or deployed to programmable hardware) running on the device. For example, National Instrument Corporation's Interchangeable Virtual Instruments (IVI) instrument drivers support programmable behavior from a host processor, but do not support programmable behavior on the device itself.

Some prior art architectures support programmable behavior on the device, but do not allow full flexibility for the custom FPGA IP to access the full data path within the device or to flexibly define its own host interface and for the host application to directly interact with it. Prior art FIG. 2 illustrates an exemplary system that includes a host device, e.g., a host computer system, and a programmable device which addresses some of the limitations exhibited by non-user-programmable devices. This architecture allows the user to add custom IP to the device itself. Furthermore, this custom IP is allowed to directly interact with the standard driver IP running on the device and read or write the data from the driver IP. This allows the user to perform certain limited tasks such as inline data processing and custom measurements.

However, the custom IP is instantiated with a limited interface to the standard driver IP and has limited connectivity to the rest of the system. It has limited access to data and trigger signals, and it does not have a direct interface to the host. The custom IP does not have the ability to access the full data path and control signals on the device. Full access to the data path and control signals constitutes being able to access data anywhere in between the front-end physical I/O signals all the way back to the bus interface between the device and the host. As FIG. 2 shows, the user application interacts with the custom IP via the device driver. The device driver is designed to permit certain types of communication between the user application and the custom IP. In this particular example, register-based communication may be the only supported method of such communication. The general limitation here is that the user application must always communicate through the standard device driver (which cannot be modified) to interact with the custom IP, thus limiting the ability of the custom IP to define arbitrary communication mechanisms between itself and the user application that might otherwise be supported by the device.

For example, the custom IP might benefit from using a DMA-based communication scheme rather than a register-based scheme. With this system, the custom IP designer does not have the independent ability to make this decision—the standard device driver must also be designed to support all of these use cases.

Another prior art architecture that allows the user to add custom IP directly to the device is illustrated in prior art FIG. 3. In this system, the user can fully customize the communication interface between the user application and the custom IP running on the device. In other words, this communication does not pass through the standard device driver at all, giving the custom IP much more flexibility in tuning the specific implementation details based upon the application requirements. However, the custom IP on the device has limited interaction with the standard driver IP. The custom IP does not have access to the standard device data inside of the driver IP, which limits the ability of the custom IP designer to offload certain data processing and system control algorithms to the device, as indicated by the "control/data" paths shown between the corresponding host and device components.

A further prior art architecture, shown in FIG. 4, makes some progress towards unifying the concepts shown in FIGS. 1-3, allowing the user to add custom IP to the device which can interact via the standard data path in the device's driver IP, and allowing the custom IP designer to fully customize the communication interface between the user application and the custom IP on the device. However, as indicated, this architecture does not use a standard device driver to expose these customization features, but rather provides sample code that implements the device driver and driver IP layers. This sample code may be owned and maintained by the end user, rather than by the device (or driver vendor, if different), and does not implement a standard API. This prevents the end user from automatically receiving driver or driver IP updates that would normally be provided by the device (and/or driver) vendor in subsequent software releases. These driver or driver IP updates would normally add such features as (but not limited to) new device support, new features, or optimizations to existing features. Instead, any time the user wants to update the sample driver or driver IP code, they have to manually re-import the new sample code and re-integrate their custom IP into the design. Because the sample code does not implement a standard API, and because the interface details of the sample code may change, this integration can be a labor-intensive process, and may be prone to errors.

Summarizing the above, each of the examples presented in prior art FIGS. 1-4 exhibits at least one of these key limitations:

1. The user cannot add custom IP that runs on the device itself.

2. The user cannot add custom IP that integrates with various operations of the standard device driver API on the host, while still preserving the functionality of the standard device driver API and maintaining the interface contract that the standard device driver API provides to the user application.

3. Custom IP on the device cannot independently define its own custom host interface. The custom IP is dependent on the standard device driver for the definition of its custom host interface.

4. Custom IP on the device does not have full access to the data path and control signals within the standard driver IP. Full access to the data path and control signals constitutes being able to access anywhere in between the front-end physical I/O signals all the way back to the bus interface between the device and the host.

5. The device (and/or driver) vendor does not provide a standard device driver and standard driver IP that exposes a well-defined API to the standard driver IP. A standard driver IP API would enable custom IP to interact directly with the driver IP without requiring any modification to the driver IP, thereby allowing the device vendor to maintain ownership of the driver IP.

Graphical programming has become a powerful tool available to programmers. Graphical programming environments such as the National Instruments LabVIEW™ development environment product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

SUMMARY OF THE INVENTION

Various embodiments of a system and method for extending programmable measurement device functionality while preserving the functionality of the device driver and driver IP are presented below.

First user input specifying custom IP for a programmable measurement device may be received, e.g., to a software tool executing on a computer system. The (target) programmable measurement device may include a programmable hardware element (or multiple programmable hardware elements) and standard driver IP provided by a vendor of the programmable measurement device. As indicated above, the term "standard" in the present context broadly means "non-user-customized, vendor owned product which has a common interface that is designed to work across multiple versions of the standard driver and driver IP". In some embodiments, such standard products may be further constrained to be vendor maintained. In other words, the customer/user is not responsible for modifying the products, and may not even be allowed to modify them.

Second user input specifying a custom IP interface for a host device may be received. The host device may include a standard device driver for the programmable measurement device that is provided by a vendor of the standard device driver (which may or may not be the same as the vendor of the programmable measurement device). The (target) host device may be configured to couple to the programmable measurement device for operation of the programmable measurement device. Note that the programmable hardware device and the host device are not necessarily present during performance of the method, or at least during performance of portions of the method.

The custom IP may be generated (e.g., automatically i.e., programmatically via software execution) based on the first user input, where the custom IP is deployable to the programmable hardware device, i.e., to configure the programmable hardware element of the programmable measurement device per the specified functionality. The custom IP interface may be generated (e.g., automatically i.e., programmatically via software execution) based on the second user input, where the custom IP interface is deployable to the host device.

Once the custom IP is deployed to the programmable measurement device, during operation of the host device and the programmable measurement device the custom IP may communicate directly with the standard driver IP and the custom IP interface, and provide custom functionality of the programmable measurement device while preserving functionality of the standard driver IP on the programmable measurement device and the standard device driver. A communication interface between the standard driver IP and the custom IP may provide full access to the data path and control signals, which may allow the custom IP to access anywhere (i.e., any place) in between the front-end physical I/O signals all the way back to the bus interface between the device and the host. Furthermore, the communication interface between the standard driver IP and the custom IP may allow the custom IP to integrate with various operations of the standard device driver API on the host, while still preserving the functionality of the standard device driver API and maintaining the interface contract that the standard device driver API provides to the user application. Said another way, the techniques and architecture disclosed herein allow custom IP to fully integrate with standard API functions that are provided by the standard device driver. In one embodiment, this is achieved by parameterizing certain behavioral characteristics of the standard device driver API, and exposing an interface (on the programmable hardware element) that allows the user to plug in custom IP (or even replace standard functionality with custom versions of the same). This allows user applications to utilize custom functionality (e.g., accelerated processing, etc.) while still using the exact same standard device driver APIs—the driver API interface contract does not change. This is an important distinction over prior art approaches and architectures.

Correspondingly, once deployed to the host device, during operation of the host device and the programmable measurement device, the custom IP interface may communicate directly with a user application executing on the host device and the custom IP, and may provide an interface between the user application and the custom IP independent of the standard device driver and the standard driver IP while preserving functionality of the standard driver IP on the programmable measurement device and the standard device driver. In other words, the method allows customization, e.g., extension or augmentation, of device features or behaviors beyond those provided by the standard device driver and driver IP without changing the functionality of standard device driver and driver IP.

In some embodiments, once the custom IP is deployed to the programmable measurement device, the custom IP may be executable to modify or control functionality of the standard device driver while preserving functionality of the standard driver IP on the programmable measurement device and the standard device driver.

In one embodiment, such customization is accomplished without any changes to the standard device driver and driver IP. In another embodiment, the customization may require that some changes be made to the standard device driver and driver IP, but not at the expense of their functionality. For example, in one embodiment, changes may be made to the driver or driver IP to facilitate communication between the device driver or driver IP and the custom IP interface or custom IP, respectively, but these changes do not interfere with the prescribed functionality of the driver or driver IP. In another embodiment, one or more functions (e.g., graphical program nodes) in the driver IP (or driver IP API) may be replaced with a corresponding function (e.g., graphical program node). However, such a replacement should still support the original functionality of the driver IP (or driver IP API).

In some embodiments, in addition to communicating directly with the user application executing on the host device and the custom IP, the custom IP interface may also (during operation) communicate directly with the standard device driver on the host device. Said another way, once deployed to the host device, during operation of the host device and the programmable measurement device, the custom IP interface may further communicate directly with the standard device driver while preserving functionality of the standard driver IP on the programmable measurement device and the standard device driver. However, it should be noted that in some embodiments, the custom IP interface may not communicate directly with the standard device driver. Thus, the novel architecture disclosed herein may allow for direct communication between custom IP and the standard driver IP on the device side, and optionally between the custom IP interface and the standard device driver on the host side, where the custom IP interface provides an interface whereby the host application can interact with the custom IP to take advantage of additional functionality provided by the custom IP, while preserving the original functionality of the standard driver IP and the standard device driver. This architecture and its variants (e.g., no direct communication between the custom IP interface and the standard device driver) overcomes each of the limitations described above with the prior art.

The user application may program custom device behavior by programming the standard device driver and custom IP APIs on the host and the standard driver IP and custom IP on the programmable measurement device. Furthermore, the custom IP may have the flexibility to independently define its API to the host-side user application via the custom IP interface. In other words, the user application does not need to go through the standard device driver in order to interact with the device-side custom IP.

Summarizing the above, important aspects of the present technique may include one or more of the following:

1. There may be two important components in implementing the overall system (besides the associated hardware, of course): the standard device driver/driver IP and custom (user) IP/custom IP interface.

2. On the programmable measurement device, the custom IP may interact with the driver IP (or device-side driver component) through well-defined interfaces (e.g., the driver IP API).

3. The driver IP API may allow the custom IP to customize the behavior of the device driver/driver IP in many new and interesting ways, without requiring any modification to the (standard) device driver/driver IP implementation. The communication interface between the standard driver IP and the custom IP may allow the custom IP to integrate with various operations of the standard device driver API on the host, while still preserving the functionality of the standard device driver API and maintaining the interface contract that the standard device driver API provides to the user application. This allows custom IP to augment or extend the capabilities of the standard device driver API while preserving the definition and meaning of the standard device driver API.

4. The user application may program custom device behavior by programming the device driver and custom (user) IP APIs, both on the host (driver and custom IP interface) and on the programmable measurement device (driver IP and custom IP).

5. The user application on the host may have direct access to the custom (user) IP on the device (i.e., the user application may not need to go through the device driver in order to interact with the device-side custom user IP).

In some embodiments, the techniques disclosed herein may be particularly directed to instrumentation devices. An instrument is a device that collects and/or generates data or information from an environment or unit under test (UUT). Instruments that collect data may also display this information to a user. An instrument may also analyze and process the data prior to displaying the data to the user or generating the data to the environment or UUT. An instrument may provide test stimuli to a UUT. Typical instruments include oscilloscopes, digital multimeters, pressure sensors, arbitrary waveform generators, RF signal analyzers, RF signal generators, etc., and the type of information which may be collected or generated by respective instruments includes voltage, resistance, distance, velocity, pressure, frequency of oscillation, humidity, or temperature, among others. Scientists and engineers often use instrumentation or DAQ (data acquisition) systems to perform a variety of functions, including test and measurement, laboratory research, process monitoring and control, data logging, analytical chemistry, test and analysis of physical phenomena, and control of mechanical or electrical machinery, to name a few examples.

In some embodiments, the techniques disclosed herein may be particularly directed to embedded control and monitoring devices. An embedded control and monitoring device is a device that is used to control and/or monitor some aspect of the physical environment (possibly including other devices). An embedded control and monitoring device has a processing element connected to various forms of I/O, which together allow the device to acquire, process, and output the resultant data. Typical applications for embedded control and monitoring devices include (but are not limited to) industrial automation and control, machine condition monitoring, structural health monitoring, in-vehicle test and logging, embedded software validation, robotics design, environmental monitoring, power monitoring, and machine design. An embedded control and monitoring device may process various forms of I/O data, including (but not limited to) voltage, pressure, current, resistance, temperature, humidity, position, imaging, and sound.

Thus, as used herein, the term "measurement device" is used to refer to any device configured to perform any of: data acquisition, data/signal stimulus generation, process or system monitoring, data/signal measurement, data/signal processing or analysis, or process or system control. Accordingly, in various embodiments, the programmable measurement device may be configured to perform one or more of: data acquisition, data/signal stimulus generation, process or system monitoring, data/signal measurement, data/signal processing or analysis, or process or system control, among other applications.

In some embodiments, the techniques disclosed herein may be particularly directed to the RF (radio frequency) domain, i.e., RF measurement devices or RF instruments, and in further embodiments, the software tool(s) implementing these techniques may specifically use high-level design software, e.g., a high-level programming language, e.g., C, C++, SystemC, the "G" graphical programming language, as provided in the LabVIEW™ graphical program development environment and its variants, among others. For example, the programmable measurement device may be or include a radio frequency (RF) device.

In other words, in some embodiments, the systems and methods disclosed herein may be limited to devices that have a physical RF interface, which may include any device that is capable of transmitting and/or receiving RF signals. Specific examples include various types of RF instrumentation, including (but not limited to) RF vector signal analyzers, RF vector signal generators, RF vector signal transceivers, RF signal generators, and RF vector network analyzers. RF instrumentation is classically used for test, measurement, and design of various types of RF hardware. Further exemplary devices contemplated include RF devices that are used in a wide variety of non-test-related wireless applications, e.g., (but are not limited to) cognitive radio, base stations for mobile wireless communications, RF user equipment emulation, RF channel modeling, wireless networking, and automatic gain control. Further devices contemplated include RF devices that have a software-defined radio architecture. Software-defined radios are RF devices that have more of their signal path components implemented in software, rather than in hardware. Software-defined radios have a flexible architecture that lends itself very well to various embedded applications, including many of the non-test-related example applications listed above.

When applied specifically to RF devices, the present techniques may make it possible for the custom IP to interface with all of the basic elements of the RF signal path within the programmable hardware element. This may include (but is not limited to) interface blocks that are used for calibration, frequency shift, phase offset, decimation, interpolation, digital gain, data triggering, read/write to onboard memory, read/write to host DMA FIFO, and/or read/write to digital I/O, among others. Access to these interface blocks may allow the custom IP to extend the RF device capabilities in many specific ways, including, for example, (but not limited to) accelerated standard RF measurements (such as instantaneous and average input power calculation, frequency domain and spectral analysis, modulation accuracy analysis, and time-domain analysis), in-line signal processing (such as digital pre-distortion, gain and offset correction, phase balancing, additive noise, and digital filtering), data reduction (such as time domain or frequency domain decimation), custom triggering (such as frequency mask triggers or combinatorial triggers), closed-loop processing and control (such as RF power servoing), as discussed below.

As noted above, in some embodiments, the techniques disclosed may be limited to being used from within a unified (or integrated) high-level system design environment, which has common design software that is used both for the components that run on the host and the components that run on the programmable hardware element (of the programmable instrumentation device). Examples of such a high-level system design environment may include (but are not limited to) a graphical system design tool or a high-level programming language which incorporates high-level synthesis techniques. This unified system design environment allows the user to use the same tool to program both the software that runs on the host and the software that runs on the programmable hardware element. This common system design environment provides the user with novel software design integration between the host processor (e.g., CPU) and the programmable hardware element on the device, which may afford users significantly increased productivity in building their application. Some system design environments may even provide a common high-level programming language that can be used to write code for the host device and for the programmable hardware element (of the programmable measurement device). The user may use the high-level programming language to provide a high-level specification of their program design both for the host and for the programmable hardware element. Then, by using high-level synthesis techniques, the system design environment may analyze the device program source code and generate the appropriate hardware function blocks for the components that run on the programmable hardware element. The same system design environment may also compile the host program source code into the appropriate instruction code for the components that run on the host device.

BRIEF DESCRIPTION OF THE DRAWINGS

A better understanding of the present invention can be obtained when the following detailed description of the preferred embodiment is considered in conjunction with the following drawings, in which:

FIGS. 11A-11C illustrate exemplary implementations of the present techniques in a system that includes an RF Vector Signal Analyzer, according to one embodiment;

Figure 1:
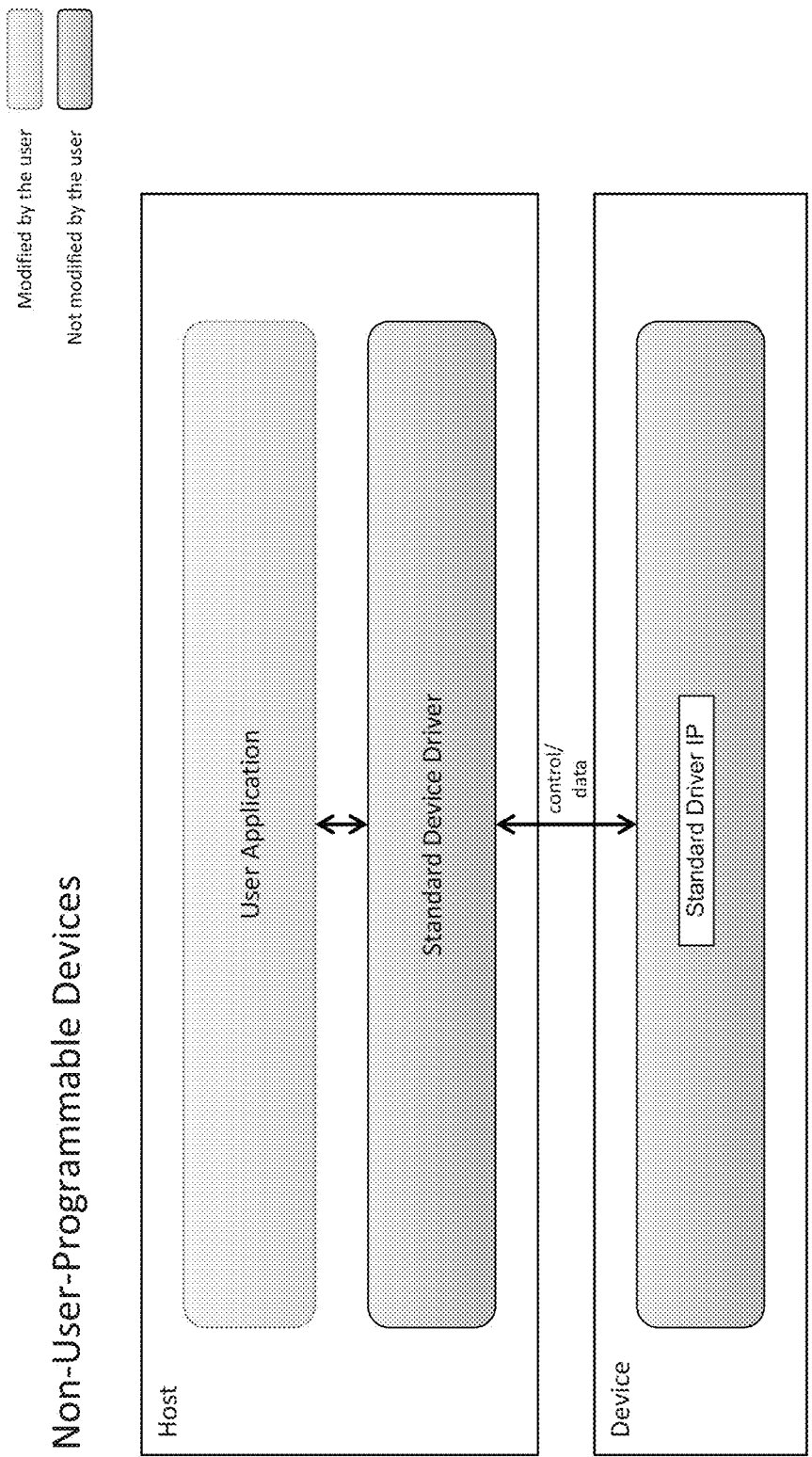
FIG. 1 illustrates an exemplary system with a non-programmable measurement device, according to the prior art.
Figure 2:
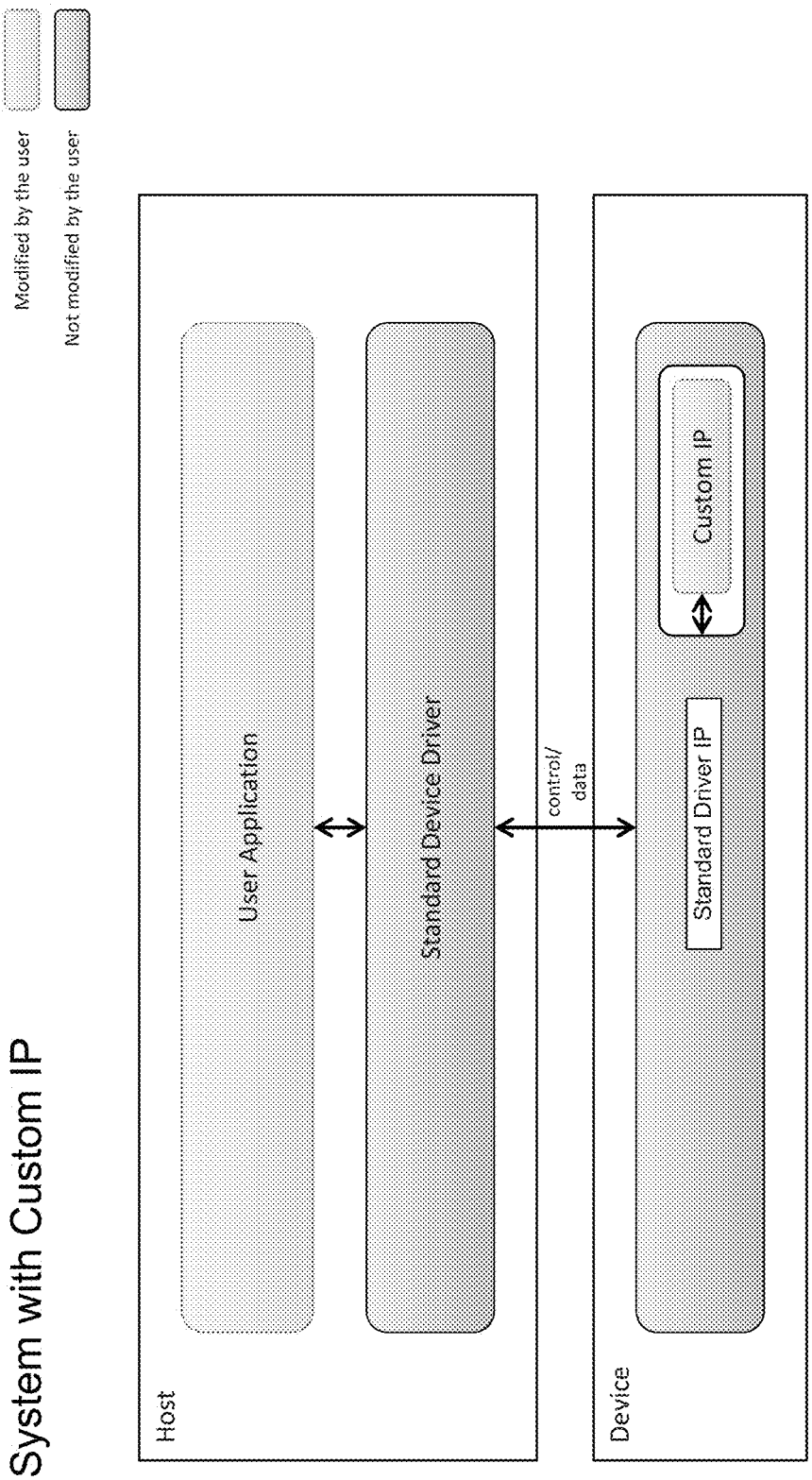
FIG. 2 illustrates an exemplary system with a programmable measurement device that includes custom IP, according to the prior art.
Figure 3:
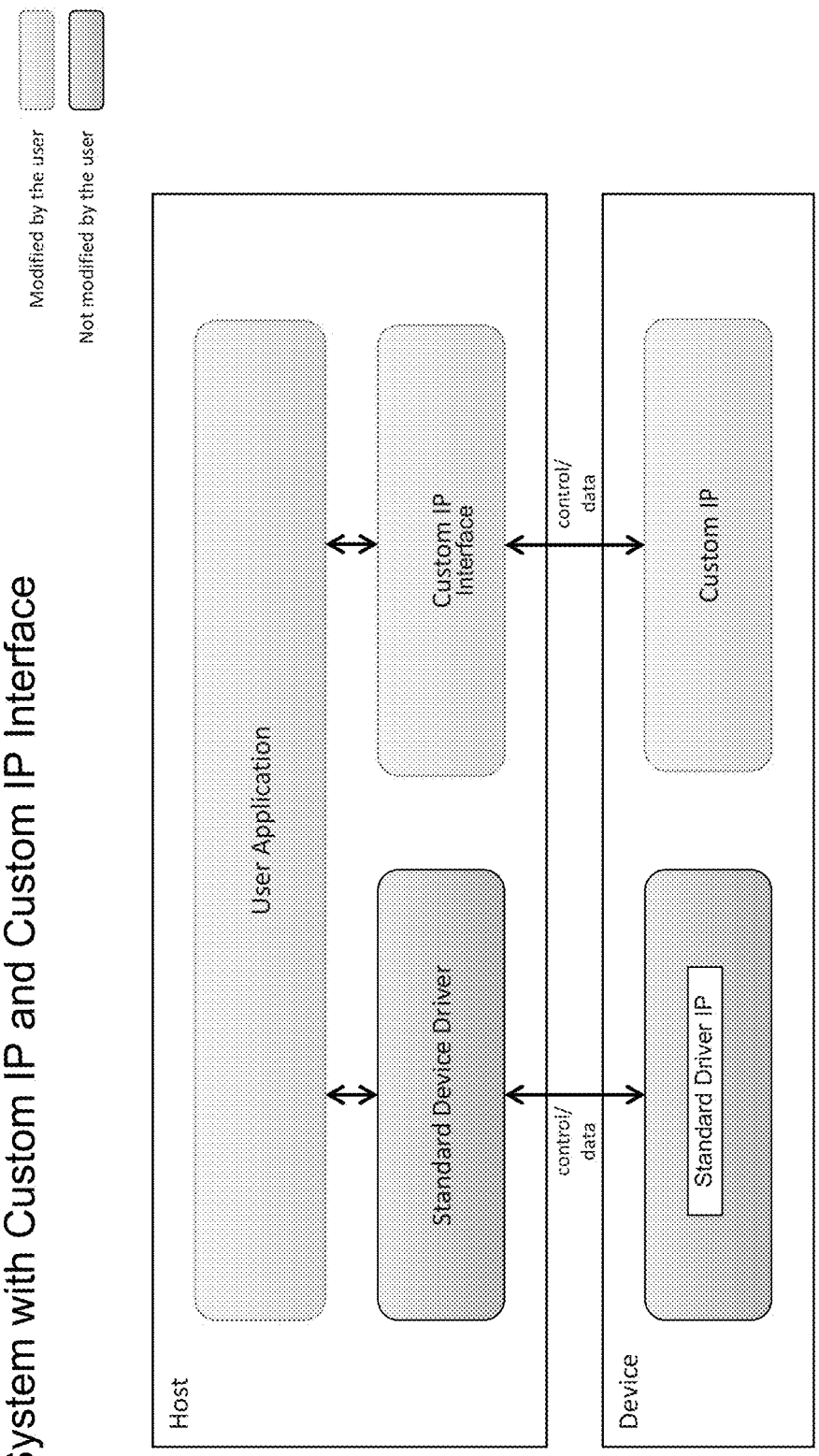
FIG. 3 illustrates an exemplary system with a programmable device that includes custom IP and a host side custom IP interface, according to the prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. Provisional Application Ser. No. 61/858,990, titled "Extending Programmable Device Functionality", filed Jul. 26, 2013.

U.S. patent application Ser. No. 13/398,529, titled "Customizing Operation of a Test Instrument Based on Information from a System Under Test", filed Feb. 16, 2012.

U.S. patent application Ser. No. 13/398,580, titled "Customizing Code Modules of Software and Programmable Hardware for a Test Instrument", filed Feb. 16, 2012.

U.S. Provisional Application Ser. No. 61/782,918, titled "Power Leveling Techniques", filed Mar. 14, 2013.

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

U.S. Pat. No. 7,089,466, titled "Instrumentation System Having a Reconfigurable Instrument Card with Programmable Logic and a Modular Daughter Card", filed Jul. 12, 2002.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/System-Build™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition and generation devices, control devices, smart sensors, and any of various types of devices that are configured to acquire, analyze, and/or store measurement data for characterizing or controlling a system or process. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

A programmable measurement device is a measurement device with a processor or programmable hardware element that may be programmed for desired functionality or behavior.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Driver IP—refers to programmable device-side logic and data that are needed to make the host (or host-side) device driver function properly. The driver IP is tightly coupled to the host device driver implementation. Effectively, the driver IP is the programmable device-side portion of the host device driver. Both the host device driver and the driver IP operate in tandem to implement standard device driver functionality. The driver IP may be stored in volatile or non-volatile memory. Furthermore, the firm driver IP ware may or may not reside on the same programmable hardware element (e.g., FPGA) as custom IP on the programmable device.

High-Level Synthesis—refers to an automated process that can analyze an algorithmic specification (e.g., program) that was written using a high-level programming language and then generate the appropriate hardware (or hardware specification) that implements that behavior. The goal of high-level synthesis is to allow designers to efficiently build, program, and verify hardware. It allows designers to reason about the program more efficiently by using higher level representations for various hardware elements.

Figure 5:
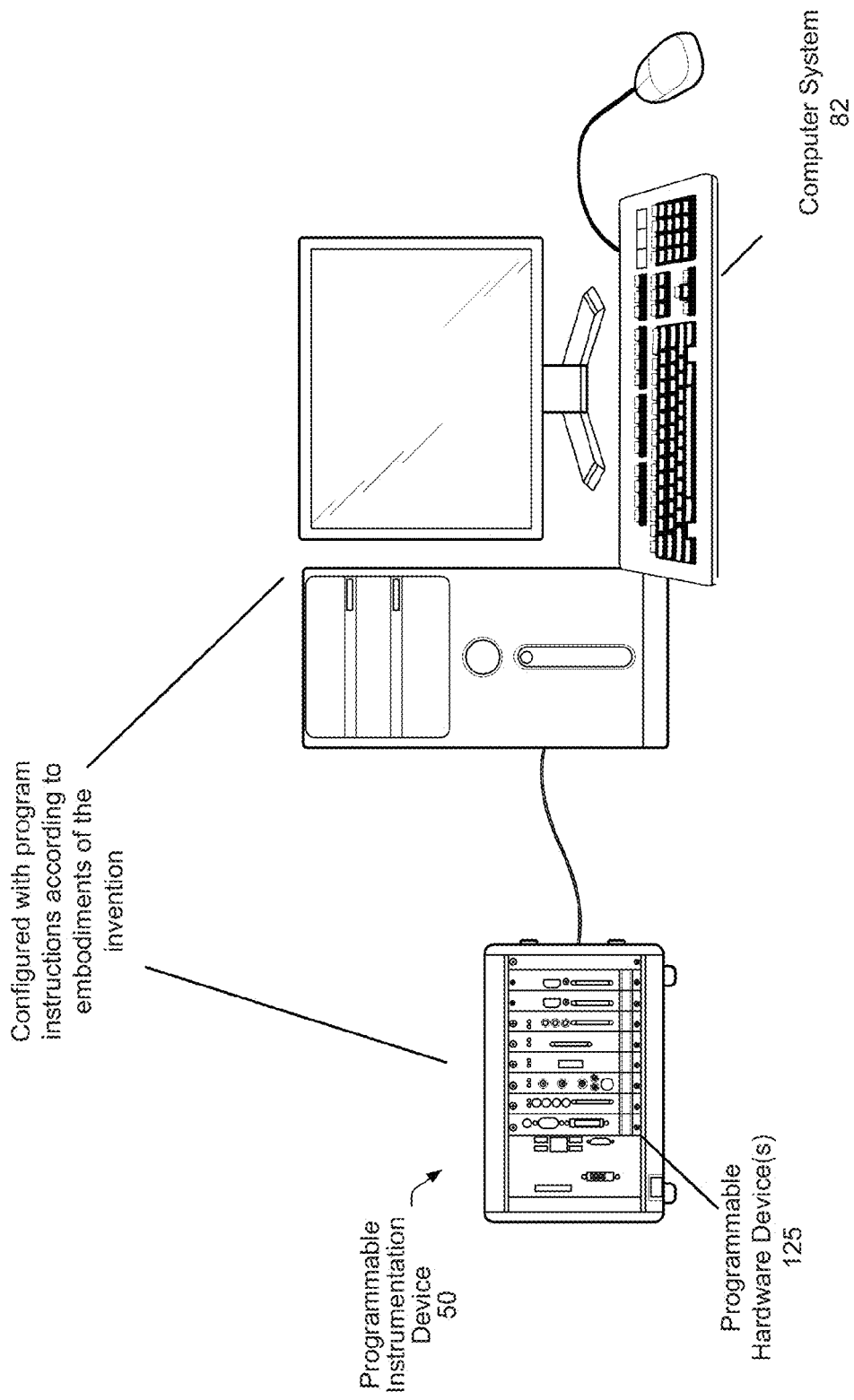
FIG. 5 illustrates an exemplary system configured to implement an embodiment of the present invention.

FIG. 5—Exemplary System

FIG. 5 illustrates an exemplary system 10 configured to implement embodiments of the present techniques. As shown in FIG. 5, the system includes a host device or system 82, e.g., a computer system 82, communicatively coupled to a programmable measurement device 50, which in this exemplary embodiment is a chassis that includes one or more programmable hardware elements, e.g., FPGAs, e.g., on one or more programmable hardware devices 125 (each of which may be a programmable measurement device), and thus is itself a programmable hardware device. However, it should be noted that in other embodiments, any other type of programmable hardware device may be used as desired. Similarly, should be noted that in various different embodiments, the host device may be a computer or workstation, such as the computer system shown in FIG. 5, a host controller, such as a controller board in a chassis, or even a host controller implemented on the same board, card, or device, as the programmable measurement device.

As shown, in the exemplary embodiment of FIG. 5, the host device is a computer system 82 that includes a display device, which may be configured to display a graphical user interface (GUI) for specifying, managing, or viewing aspects of the techniques disclosed herein. For example, the display device may be configured to display a graphical user interface of a user's application, e.g., a front panel of a graphical program, during execution of the application program on the host device. The graphical user interface may comprise any type of graphical user interface, e.g., depending on the computing platform.

The computer system 82, or more generally, the host device, may include at least one memory medium on which one or more computer programs or software components according to one embodiment of the present invention may be stored. For example, the memory medium may store one or more graphical programs which are executable to implement the present techniques and/or to perform the methods described herein. Additionally, the memory medium may store a (possibly graphical) programming development environment application used to create and/or execute such (possibly graphical) programs. The memory medium may also store operating system software, as well as other software for operation of the computer system. Various embodiments further include receiving or storing instructions and/or data implemented in accordance with the foregoing description upon a carrier medium.

In various embodiments, the host device 82 may be coupled to a second computer system or device via a network (or a computer bus). The computer systems may each be any of various types, as desired. The network can also be any of various types, including a LAN (local area network), WAN (wide area network), the Internet, or an Intranet, among others. Similarly, the host device 82 may be coupled to the programmable measurement device 50 via various mechanisms.

Note that while much of the description herein is in terms of graphical programs, the techniques disclosed are broadly applicable to textual or text-based programs as well.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 6A:
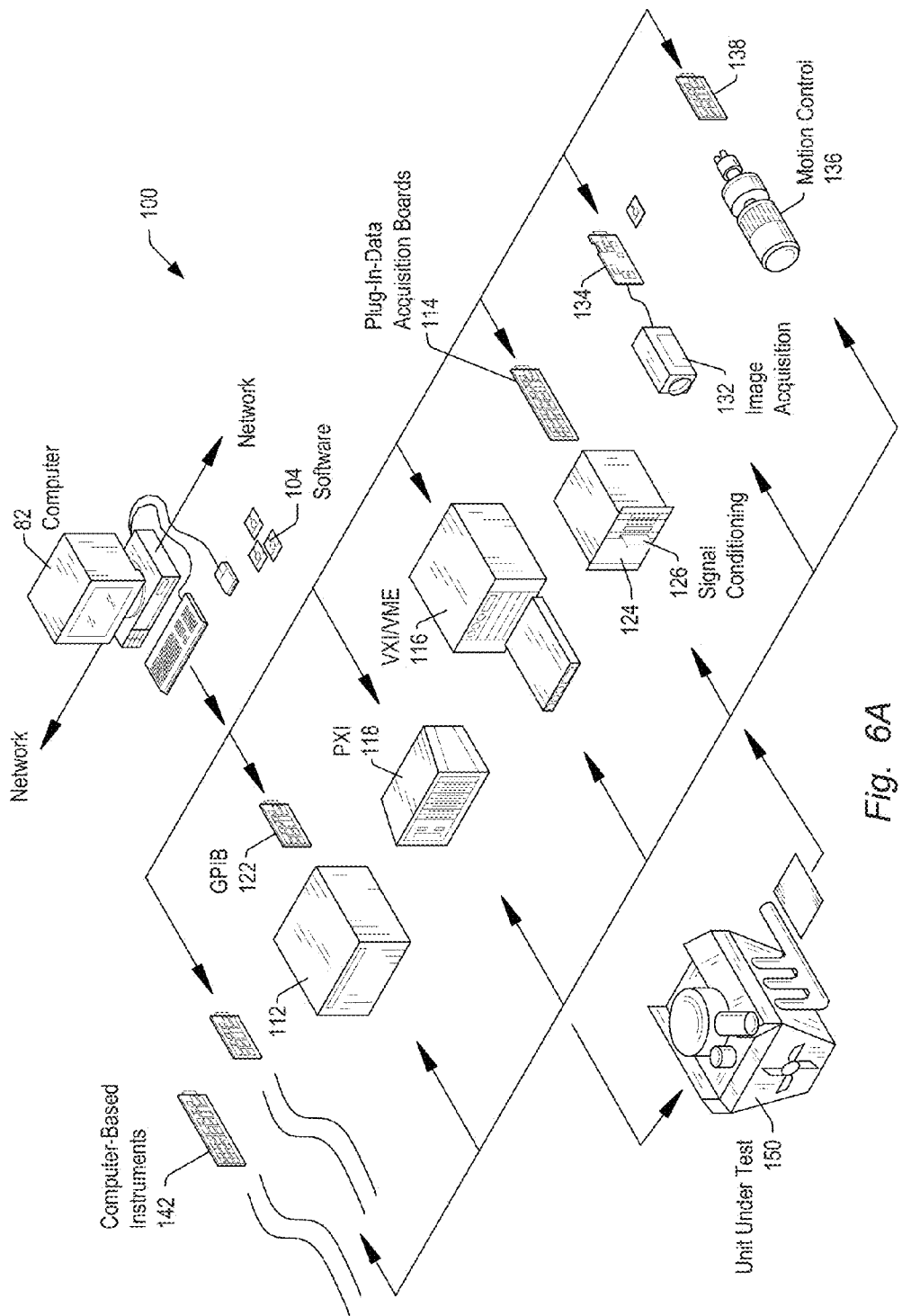
FIGS. 6A and 6B respectively illustrate an instrumentation control system and an industrial automation system, according to embodiments of the invention.

FIG. 6A illustrates an exemplary instrumentation control system 100 which may implement embodiments of the invention. The system 100 comprises a host device, e.g., computer 82, which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150, e.g., via execution of software 104.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 6B:
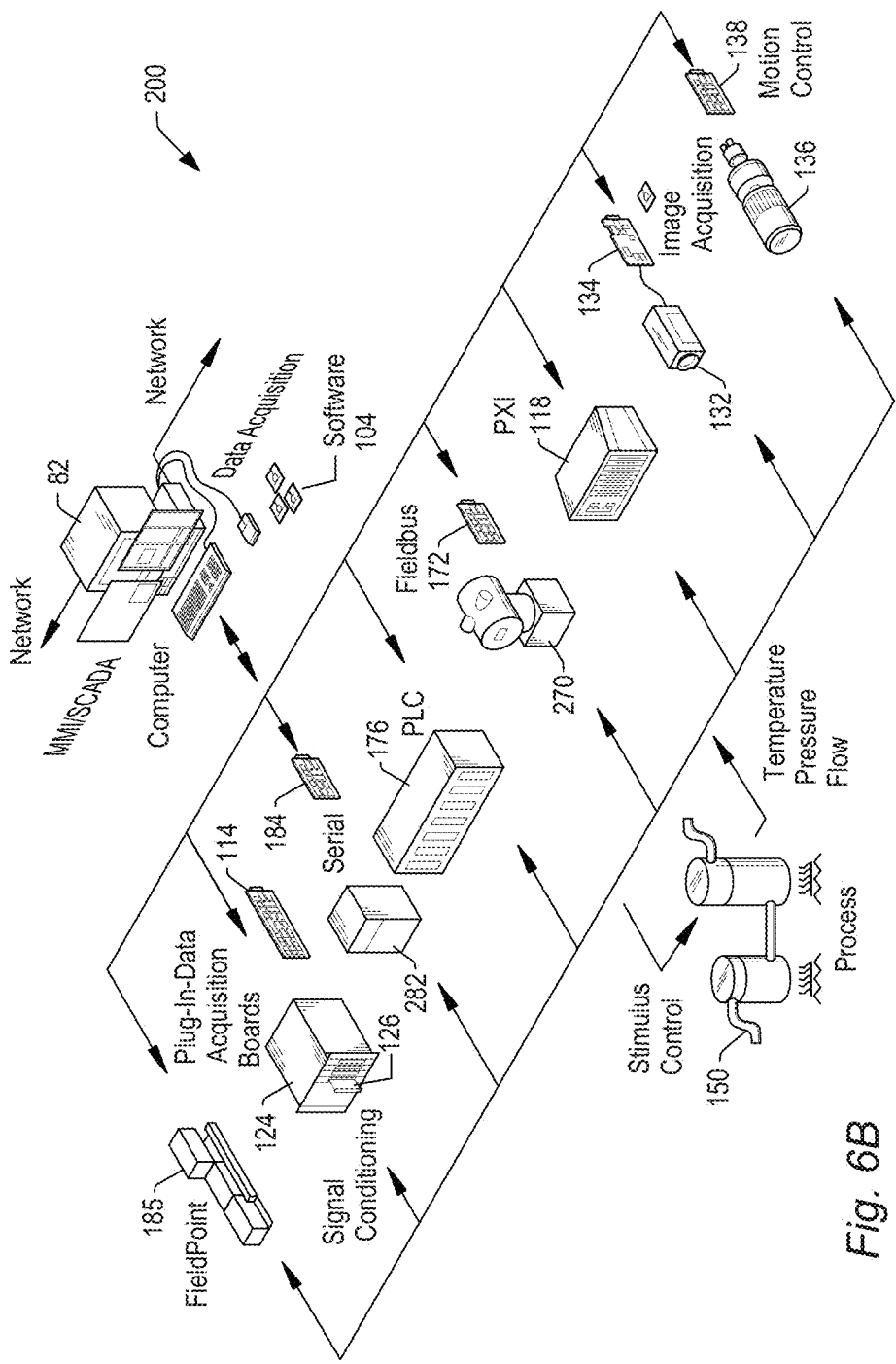

FIG. 6B illustrates an exemplary industrial automation system 200 which may implement embodiments of the invention. The industrial automation system 200 is similar to the instrumentation or test and measurement system 100 shown in FIG. 6A. Elements which are similar or identical to elements in FIG. 6A have the same reference numerals for convenience. The system 200 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others, e.g., via execution of software 104.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 270 and associated fieldbus interface card 172, a PLC (Programmable Logic Controller) 176, a serial instrument 282 and associated serial interface card 184, or a distributed data acquisition system, such as the Fieldpoint system available from National Instruments, among other types of devices.

Figure 7A:
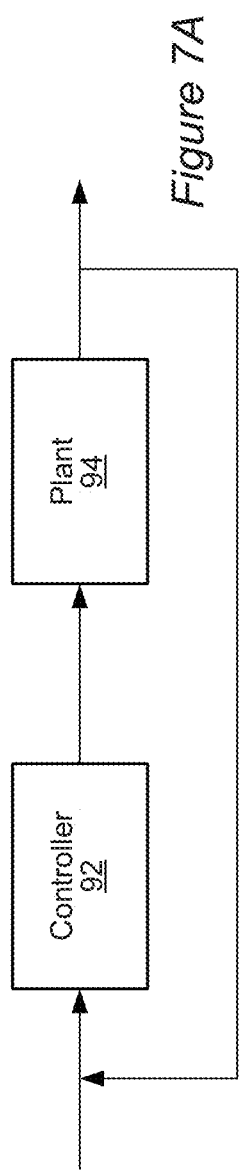
FIG. 7A is a high level block diagram of an exemplary system which may execute or utilize graphical programs.

FIG. 7A is a high level block diagram of an exemplary system which may execute or utilize graphical programs. FIG. 7A illustrates a general high-level block diagram of a generic control and/or simulation system which comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a graphical program that specifies or implements the functionality of one or both of the controller 92 and the plant 94. For example, a control engineer may use a modeling and simulation tool to create a model (graphical program) of the plant 94 and/or to create the algorithm (graphical program) for the controller 92.

Figure 7B:
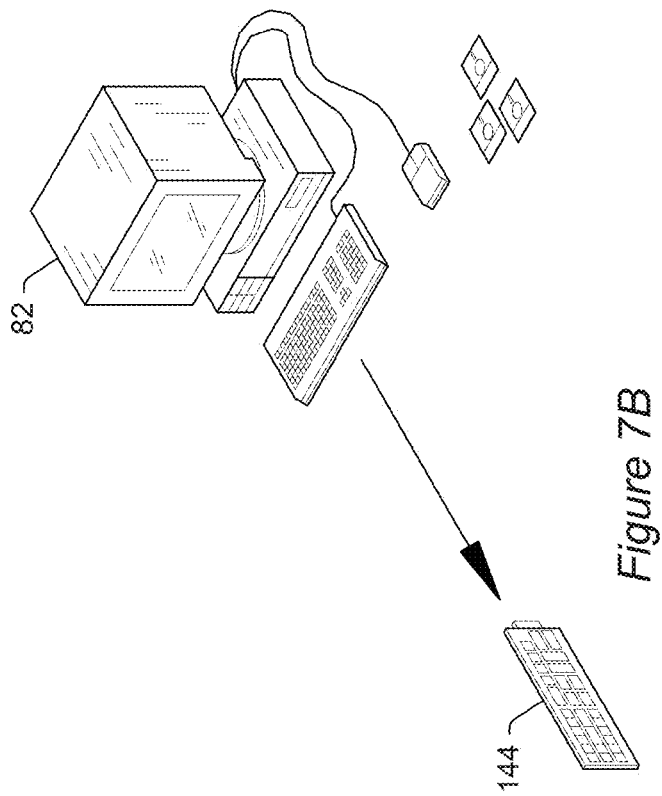
FIG. 7B illustrates an exemplary system which may perform control and/or simulation functions utilizing graphical programs.

FIG. 7B illustrates an exemplary system which may perform control and/or simulation functions. As shown, the controller 92 may be implemented by a computer system 82 or other device (e.g., including a processor and memory medium and/or including a programmable hardware element) that executes or implements a graphical program. In a similar manner, the plant 94 may be implemented by a computer system or other device 144 (e.g., including a processor and memory medium and/or including a programmable hardware element) that executes or implements a graphical program, or may be implemented in or as a real physical system, e.g., a car engine.

In one embodiment of the invention, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real time execution, e.g., a device including a processor that executes a real time operating system (RTOS), or a device including a programmable hardware element.

In one embodiment of the invention, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 6A, 6B, and 7B above, one or more of the various devices may couple to each other over a network, such as the Internet. In one embodiment, the user operates to select a target device from a plurality of possible target devices for programming or configuration using a graphical program. Thus the user may create a graphical program on a computer and use (execute) the graphical program on that computer or deploy the graphical program to a target device (for remote execution on the target device) that is remotely located from the computer and coupled to the computer through a network. Graphical software programs which perform data acquisition, analysis and/or presentation, e.g., for measurement, instrumentation control, industrial automation, modeling, or simulation, such as in the applications shown in FIGS. 6A and 6B, may be referred to as virtual instruments.

Figure 8:
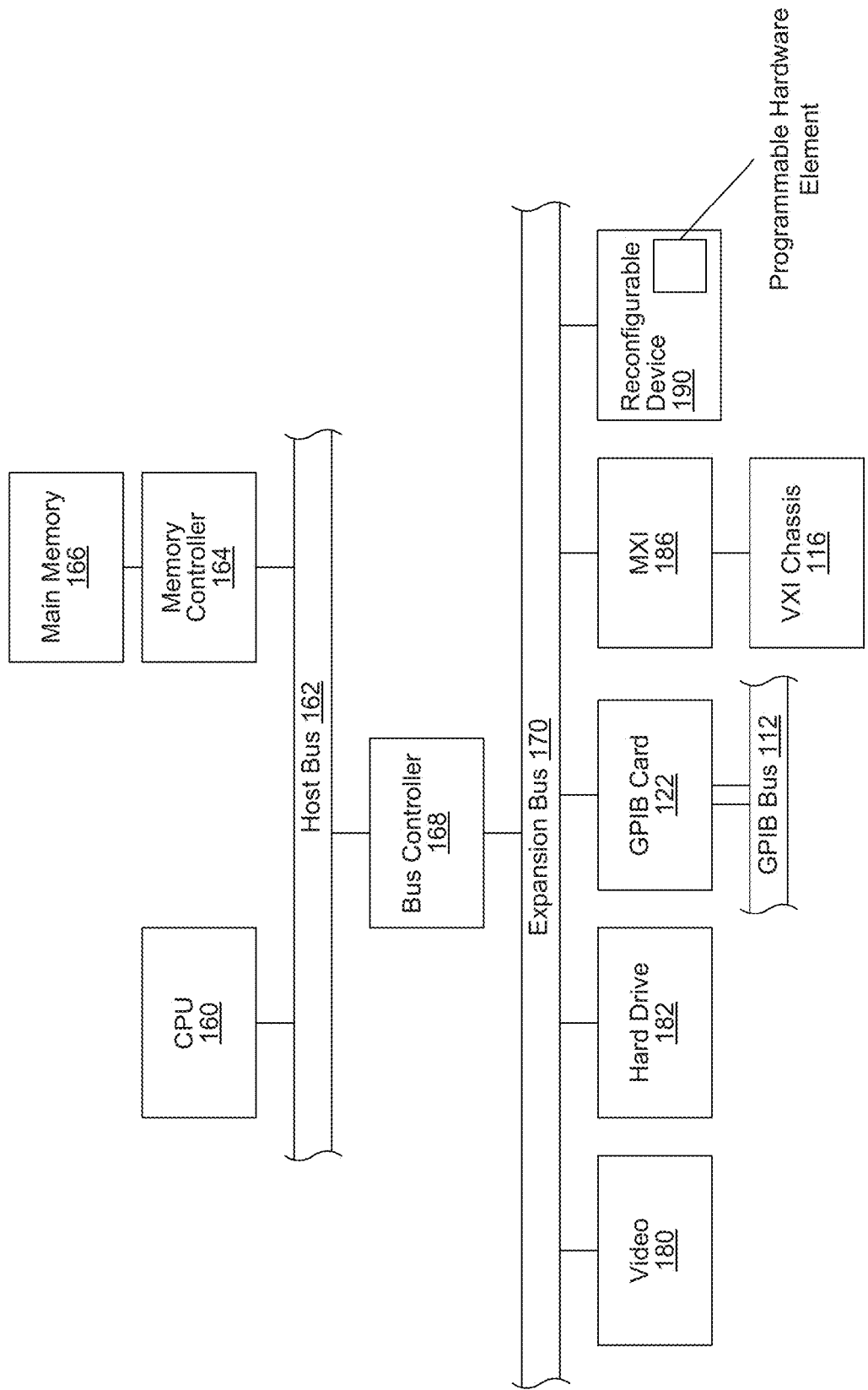
FIG. 8 is an exemplary block diagram of the computer systems of FIGS. 5A, 5B, 6A and 6B and 7B.

FIG. 8—Computer System Block Diagram

Figure 4:
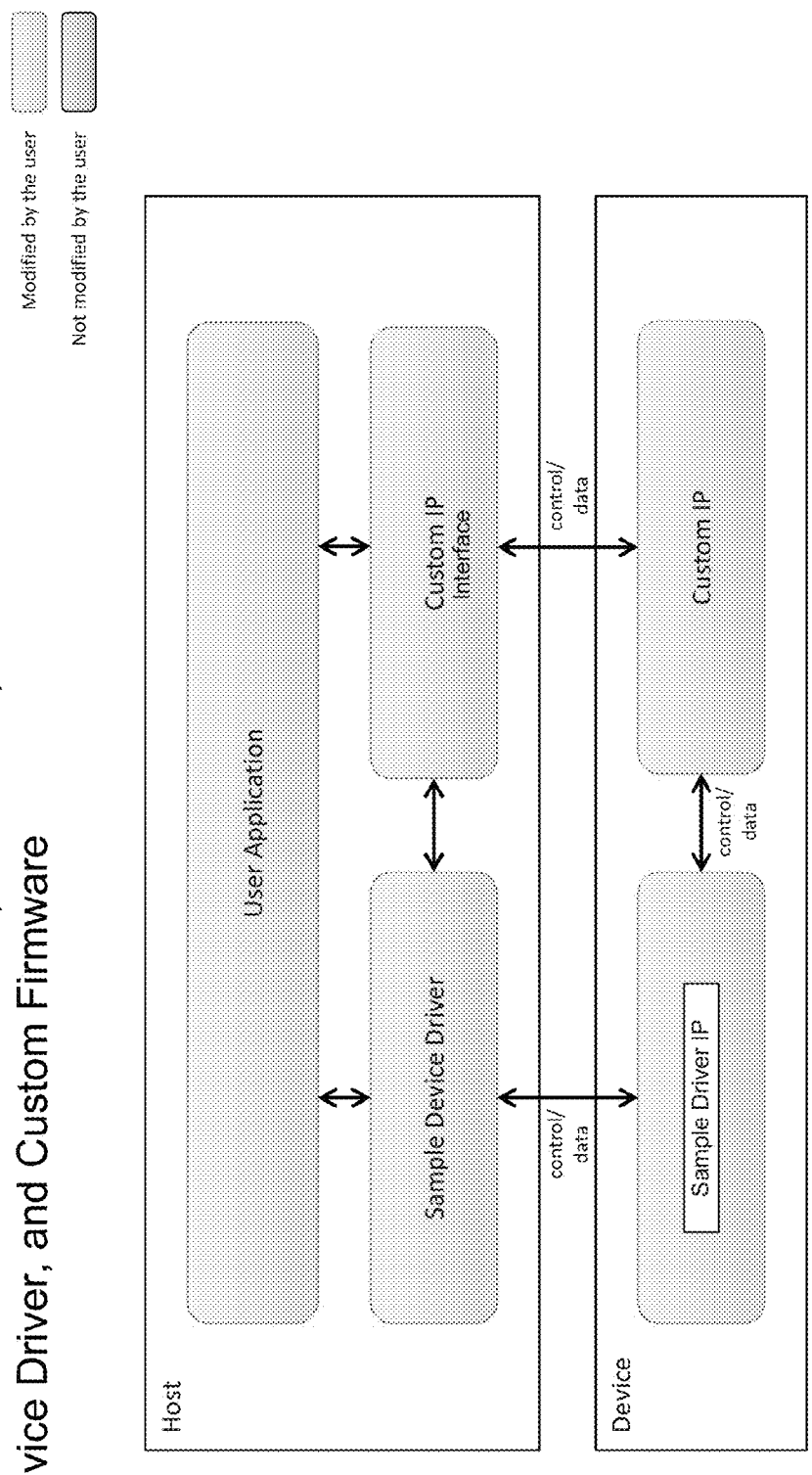
FIG. 4 illustrates an exemplary system with a programmable device that includes custom IP, a custom IP interface, custom device driver, and custom driver IP, according to the prior art.

FIG. 4 is a block diagram representing one embodiment of the computer system 82 in FIG. 5, FIG. 6A, or 6B. It is noted that any type of computer system configuration or architecture can be used as desired, and FIG. 8 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit (CPU) or other type of processor 160 which is coupled to a processor or host bus 162. The CPU 160 may be any of various types, including an x86 processor, e.g., a Pentium class, Core processor, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store one or more programs configured to implement embodiments of the techniques disclosed herein. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a programmable (reconfigurable) hardware device 190 (or, per FIG. 5, programmable hardware device 50) may also be connected to the computer, e.g., such as an instrument. As indicated, the device 190 may include at least one programmable hardware element, e.g., an FPGA. The computer system may be configured to deploy a graphical program to the device 190 for execution of the graphical program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program.

In accordance with embodiments of the techniques disclosed herein, the computer system may be configured to execute a user's application program, which may interact with the device 190 via a standard (e.g., vendor supplied) device driver (program) and (host-side) custom IP interface, which may also be referred to as a (host side) custom IP API (or a program utilizing such). Correspondingly, the device 190 may be configured with standard (e.g., vendor supplied) driver IP and custom IP that specifies functionality of the device 190, as described in more detail below.

Figure 9:
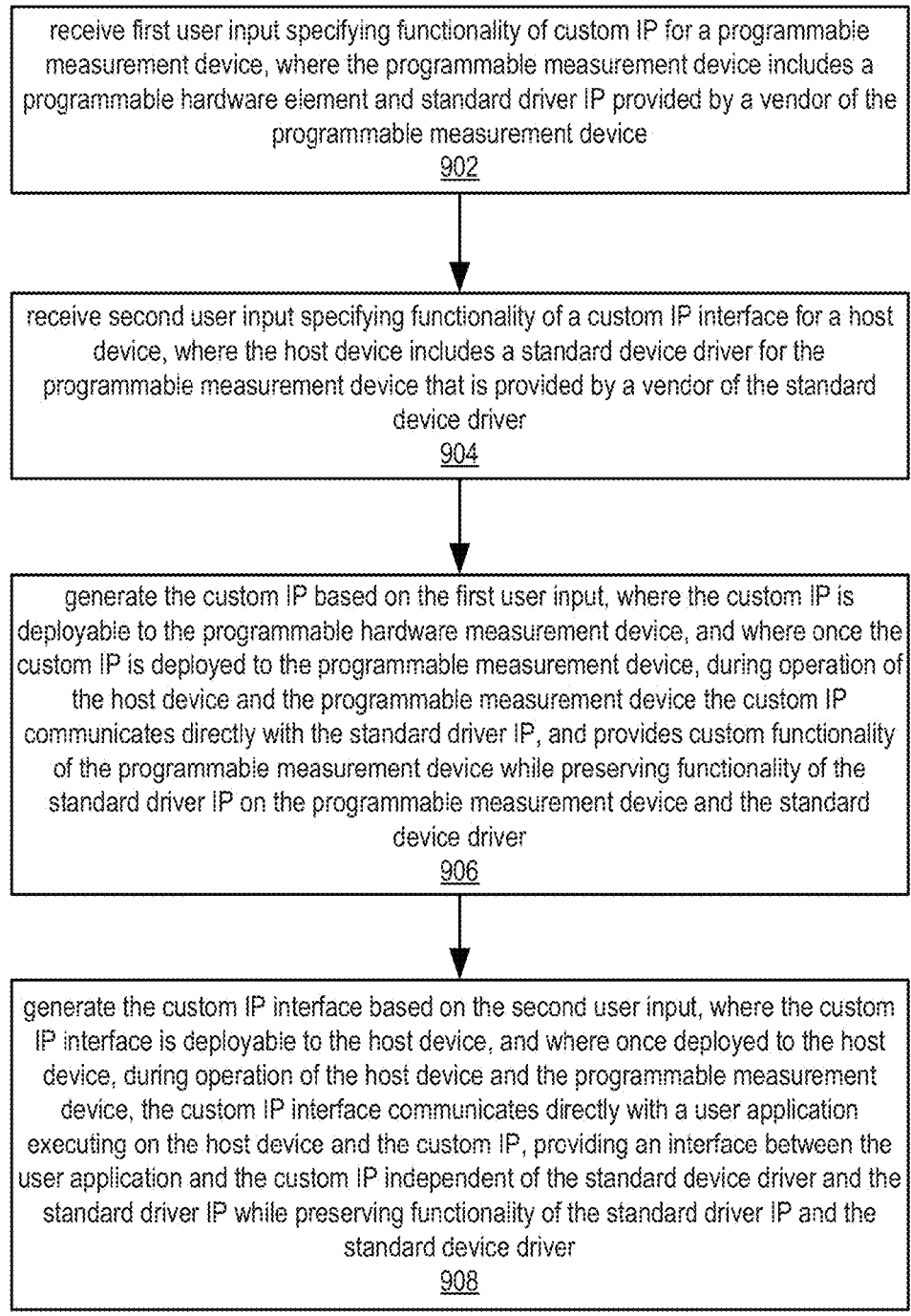
FIG. 9 is a flowchart diagram illustrating one embodiment of a method for extending programmable measurement device functionality while preserving the functionality of the device driver and driver IP, according to one embodiment.

FIG. 9—Flowchart of Method for Extending Programmable Measurement Device Functionality FIG. 9 illustrates a method for extending programmable measurement device functionality while preserving the functionality of the (standard) device driver and (standard) driver IP. The method shown in FIG. 9 may be used in conjunction with any of the computer systems or devices shown in the above-described Figures, among other devices. In various embodiments, some of the method elements shown may be performed concurrently, in a different order than shown, or may be omitted. Additional method elements may also be performed as desired. As shown, this method may operate as follows.

In 902, first user input specifying custom IP for a programmable measurement device may be received, e.g., to a software tool executing on a computer system. The (target) programmable measurement device may include a programmable hardware element (or multiple programmable hardware elements) and standard driver IP provided by a vendor of the standard device driver (which may or may not be the same as the vendor of the programmable measurement device). As indicated above, the term "standard" in the present context broadly means "non-user-customized, vendor owned product which has a common interface that is designed to work across multiple versions of the standard driver and driver IP". In some embodiments, such standard products may be further constrained to be vendor maintained. In other words, the customer/user is not responsible for modifying the products, and in some embodiments may not even be allowed to modify them. In various embodiments, the programmable measurement device may be configured to perform one or more of: data acquisition, data/signal stimulus generation, process or system monitoring, data/signal measurement, data/signal processing or analysis, or process or system control, among other applications.

As indicated in 904, in some embodiments, second user input specifying a custom IP interface for a host device may be received. The host device may include a standard device driver for the programmable measurement device that is provided by the vendor of the standard device driver. The (target) host device may be configured to couple to the programmable measurement device for operation of the programmable measurement device. Note that the programmable hardware device and the host device are not necessarily present during performance of the method, or at least during performance of portions of the method.

In 906, the custom IP may be generated (e.g., automatically i.e., programmatically via software execution) based on the first user input, where the custom IP is deployable to the programmable hardware device, i.e., to configure the programmable hardware element of the programmable measurement device per the specified functionality. Once the custom IP is deployed to the programmable measurement device, during operation of the host device and the programmable measurement device the custom IP may communicate directly with the standard driver IP, and may provide custom functionality of the programmable measurement device while preserving functionality of the standard driver IP on the programmable measurement device and the standard device driver.

Note that in some embodiments, the functionality of the standard driver IP and/or the standard device driver may include the application programming interface (API) of the standard driver IP and/or the standard device driver, respectively. In other embodiments, the functionality may be separate and distinct from the API(s). Note further that as used herein, the term "functionality of the standard driver IP" refers to the functionality of the standard driver IP that is used by the user application. Similarly, the term "functionality of the standard device driver" refers to the functionality of the standard device driver that is used by the user application.

As indicated in 908, in embodiments that include method element 904, the custom IP interface may be generated (e.g., automatically i.e., programmatically via software execution) based on the second user input, where the custom IP interface is deployable to the host device.

A communication interface between the standard driver IP and the custom IP may provide full access to the data path and control signals, which may allow the custom IP to access anywhere (i.e., any place) in between the front-end physical I/O signals all the way back to the bus interface between the device and the host. Furthermore, the communication interface between the standard driver IP and the custom IP may allow the custom IP to integrate with various operations of the standard device driver API on the host, while still preserving the functionality of the standard device driver API and maintaining the interface contract that the standard device driver API provides to the user application. Said another way, the techniques and architecture disclosed herein allow custom IP to fully integrate with standard API functions that are provided by the standard device driver. In one embodiment, this is achieved by parameterizing certain behavioral characteristics of the standard device driver API, and exposing an interface (on the programmable hardware element) that allows the user to plug in custom IP (or even replace standard functionality with custom versions of the same). This allows user applications to utilize custom functionality (e.g., accelerated processing, etc.) while still using the exact same standard device driver APIs—the driver API interface contract does not change. This is an important distinction over prior art approaches and architectures.

Correspondingly, in some embodiments that include method elements 904 and 908, once the custom IP interface is deployed to the host device, during operation of the host device and the programmable measurement device, the custom IP interface may communicate directly with a user application executing on the host device and the custom IP, and may provide an interface between the user application and the custom IP independent of the standard device driver and the standard driver IP while preserving functionality of the standard driver IP on the programmable measurement device and the standard device driver. In other words, the method allows customization, e.g., extension or augmentation, of device features or behaviors beyond those provided by the standard device driver and driver IP without changing the functionality of standard device driver and driver IP.

In some embodiments, once the custom IP is deployed to the programmable measurement device, the custom IP may be executable to modify or control functionality of the standard device driver while preserving functionality of the standard driver IP on the programmable measurement device and the standard device driver.

In one embodiment, such customization is accomplished without any changes to the standard device driver and driver IP. In another embodiment, the customization may require that some changes be made to the standard device driver and driver IP, but not at the expense of their functionality. For example, in one embodiment, changes may be made to the driver or driver IP to facilitate communication between the device driver or driver IP and the custom IP interface or custom IP, respectively, but these changes do not interfere with the prescribed functionality of the driver or driver IP. In another embodiment, one or more functions (e.g., graphical program nodes) in the driver IP (or driver IP API) may be replaced with a corresponding function (e.g., graphical program node). However, such a replacement should still support the original functionality of the driver IP (or driver IP API).

Figure 10:
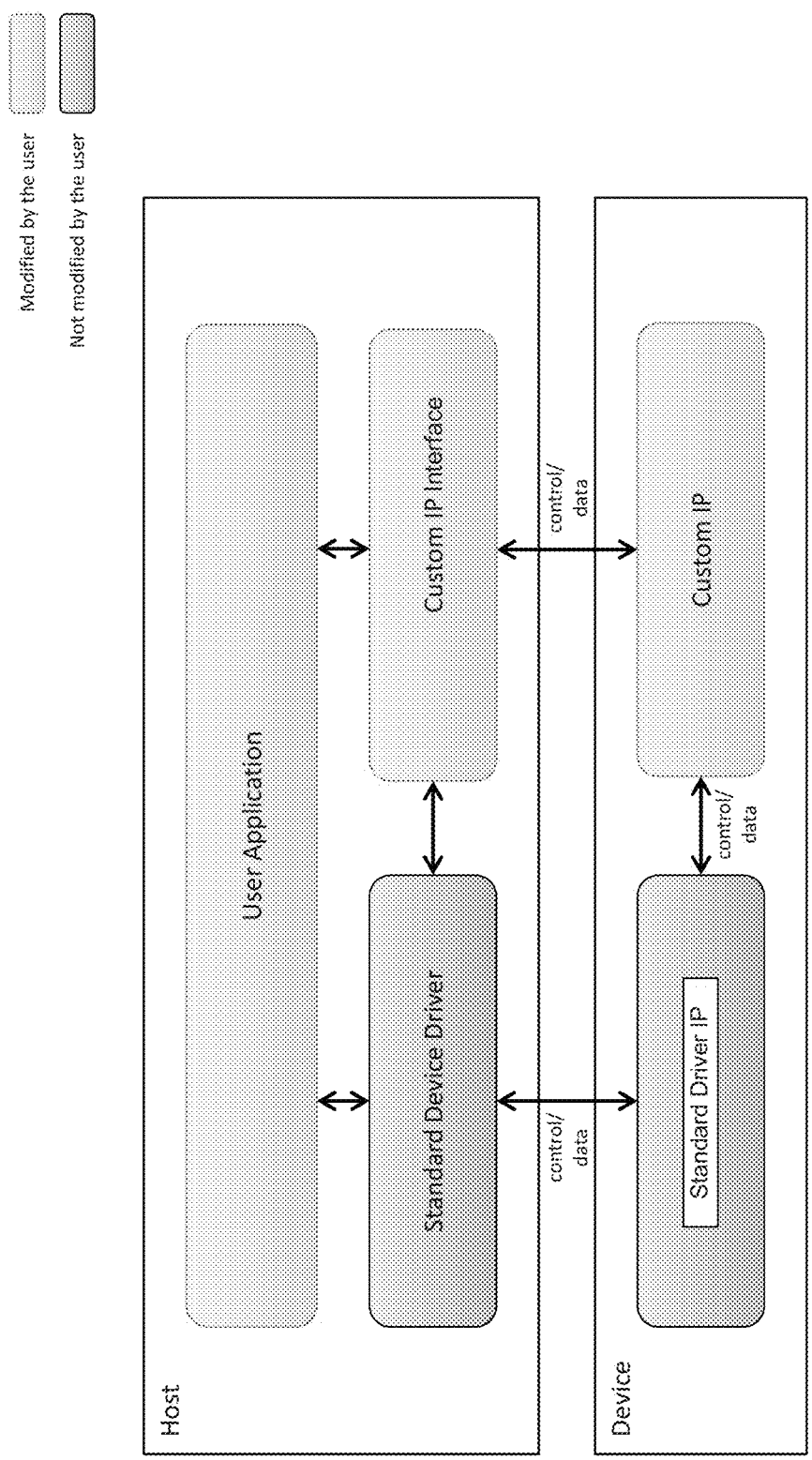
FIG. 10 illustrates an exemplary system implementing an embodiment of the present techniques directed to programmable hardware extensions.

FIG. 10 is a high level block diagram illustrating an exemplary system implementing an embodiment of the present techniques directed to extending programmable measurement device functionality while preserving the functionality of the (standard) device driver and (standard) driver IP. As FIG. 10 shows, a (programmable hardware) device, such as device 50 or 190 mentioned above, or some other programmable measurement device, is provided with standard (i.e., non-user-customized vendor provided) driver IP and custom (e.g., user customizable) IP. Correspondingly, a host device is provided with a standard (i.e., non-user-customized vendor provided) device driver (program) and custom (or user customizable) programs, specifically, a user application program and a custom IP interface, whereby the host device communicates with the device. The host and device are communicatively coupled via transmission means, e.g., wired or wireless means.

As indicated by the double ended arrows between components, in this exemplary embodiment the user application is configured to communicate with the standard device driver and the custom IP interface; the custom IP interface is configured to communicate with the user application and the standard device driver on the host side, and the custom IP on the device side; and the custom IP is configured to communicate with the custom IP interface and the standard driver IP on the device side. As also shown, in this embodiment, the standard device driver is configured to communicate with the user application and the custom IP interface on the host side, as well as the standard driver IP on the device side; and the standard driver IP is configured to communicate with the standard device driver on the host side, and the custom IP on the device side.

Thus, in some embodiments, in addition to communicating directly with the user application executing on the host device and the custom IP, the custom IP interface may also (during operation) communicate directly with the standard device driver on the host device, as indicated in FIG. 10 and in various subsequent figures directed to further exemplary embodiments. Said another way, once deployed to the host device, during operation of the host device and the programmable measurement device, the custom IP interface may further communicate directly with the standard device driver while preserving functionality of the standard driver IP on the programmable measurement device and the standard device driver. However, it should be noted that in some embodiments, the custom IP interface may not communicate directly with the standard device driver. In other words, as a variant of the embodiment of FIG. 10, in some embodiments there is no direct communication between the custom IP interface and the standard device driver.

Thus, the novel architecture disclosed in FIG. 10 allows for direct communication between custom IP and the standard driver IP on the device side, and optionally between the custom IP interface and the standard device driver on the host side, where the custom IP interface provides an interface whereby the host application can interact with the custom IP to take advantage of additional functionality provided by the custom IP, while preserving the original functionality of the standard driver IP and the standard device driver.

This architecture and its variants (e.g., no direct communication between the custom IP interface and the standard device driver) overcomes each of the limitations described above with the prior art. As explained above and shown in FIG. 10, this approach uses standard (non-user-customized vendor provided) components, specifically, the standard device driver and driver IP, and custom (user created or customizable) components, specifically, the custom (user) IP and custom IP interface. Thus, the standard and custom portions have both host and programmable measurement device (e.g., FPGA) presence. In some embodiments, the driver IP may be considered to be the device-side component of the standard driver, and the custom IP interface may be considered to be the host-side component of the custom IP.

On the programmable measurement device (e.g., on the programmable hardware element), the custom IP may interact with the standard driver IP through well-defined interfaces. These interfaces may be provided to the user by the device vendor and may include or implement the API for the standard driver IP. The standard driver IP API may allow the custom IP to customize, augment, or extend the behavior of the device in new and interesting ways without requiring any modification to the standard device driver or driver IP implementations. For example, the API may allow the user to access the driver IP's control and data paths at various different places. This enables various custom triggering and real-time signal processing operations. The user can thus extend the behavior of the standard device driver and standard driver IP without requiring any modification to the device driver and driver IP implementation.

The user application may program custom device behavior by programming the standard device driver and custom IP APIs on the host and the standard driver IP and custom IP on the programmable measurement device. Furthermore, the custom IP may have the flexibility to independently define its API to the host-side user application via the custom IP interface. In other words, the user application does not need to go through the standard device driver in order to interact with the device-side custom IP.

Summarizing the above, important aspects of the present technique may include one or more of the following:

1. There may be two important components in implementing the overall system (besides the associated hardware, of course): the standard device driver/driver IP and custom (user) IP/custom IP interface.

2. On the programmable measurement device, the custom IP may interact with the driver IP (or device-side driver component) through well-defined interfaces (e.g., the driver IP API).

3. The driver IP API may allow the custom IP to customize the behavior of the device driver/driver IP in many new and interesting ways, without requiring any modification to the (standard) device driver/driver IP implementation, and while still preserving the functionality of the standard device driver API and maintaining the interface contract that the standard device driver API provides to the user application.

4. The user application may program custom device behavior by programming the device driver and custom (user) IP APIs, both on the host (driver and custom IP interface) and on the programmable measurement device (driver IP and custom IP).

5. The user application on the host may have direct access to the custom (user) IP on the device (i.e., the user application may not need to go through the device driver in order to interact with the device-side custom user IP).

Note that the custom IP and custom IP interface are separate and distinct from the device driver and driver IP.

Note further that in some embodiments, the techniques disclosed herein, e.g., the method elements of the method of FIG. 9, may be implemented and performed by a (single) high-level design tool. In other words, a high-level design tool may be provided that is executable to perform the above receiving first user input (902), receiving second user input (904), generating the custom IP (906), and generating the custom IP interface (908), e.g., as opposed to a collection of separate and independent programs useable together to provide the same functionality, although such implementations are also contemplated as falling within the scope of the present invention.

Exemplary Embodiments

The following describes various further exemplary embodiments of the above techniques, although the embodiments described are exemplary only, and are not intended to limit the systems and methods to any particular form, function, or appearance.

In some embodiments, the first user input specifying custom IP may include one or more of: user input defining functionality of the custom IP, or user input selecting the custom IP from a set of predefined custom IPs. Similarly, the second user input specifying a custom IP interface may include one or more of: user input defining functionality of the custom IP interface, or user input selecting the custom IP interface from a set of predefined custom IP interfaces. In other words, the user may specify either or both of these items by specifying the program code itself, e.g., by entering textual program code or dragging, dropping, and connecting graphical program elements, thereby specifying functionality of the custom IP or custom IP interface, or by selecting one or both of them from a set of predefined items, e.g., a library of custom IPs or custom IP interfaces.

In one embodiment, the method may further include receiving user input specifying the user application, and generating the user application based on the user input specifying the user application. For example, the method may be performed by an integrated development environment whereby the user may also create application programs.

In some embodiments, generating the custom IP may include generating a hardware configuration program based on the first user input or defined functionality, where the hardware configuration program implements the custom IP. For example, the first user input may specify or define a program, e.g., a graphical program, and the hardware configuration program may be generated based on the program, e.g., via compilation for the target device. Alternatively, the first user input may select a predefined custom IP, e.g., in the form of program source code, e.g., graphical program source code, and the hardware configuration program may be generated based on the program source code. In a further embodiment, the custom IP may already be compiled, but may require some processing before being deployable to the target hardware, e.g., one or more custom IP modules or elements may need to be "stitched together" or otherwise integrated, prior to conversion to the hardware configuration program.

The custom IP may be deployable to the programmable measurement device by deploying the hardware configuration program to the programmable measurement device. For example, the hardware configuration program may be or include a netlist or bitstream (or bitfile), useable to configure the programmable hardware element (or multiple such elements) on the programmable measurement device.

In some embodiments, the method may further include deploying the custom IP interface to the host device, and may also include deploying the custom IP to the programmable measurement device, thereby configuring the device for conjunctive operation with the host device. The method may further include deploying the user application to the host device, which may execute to perform some specified functionality via interaction with (e.g., communication with and/or control of) the programmable measurement device.

As noted above, the above techniques are broadly applicable in any of a variety of application domains. For example, in various embodiments, the user application may be executable on the host device in conjunction with operation of the programmable measurement device to perform one or more of: an industrial automation function, a process control function, or a test and measurement function, among others.

In some embodiments, the techniques disclosed herein may be particularly directed to the RF (radio frequency) domain, and in further embodiments, the software tool(s) implementing these techniques may specifically use high-level design software, e.g., a high-level programming language, e.g., C, C++, SystemC, the "G" graphical programming language, as provided in the LabVIEW™ graphical program development environment and its variants, among others. For example, the programmable measurement device may be or include a radio frequency (RF) device.

In other words, in some embodiments, the systems and methods disclosed herein may be limited to devices that have a physical RF interface, which may include any device that is capable of transmitting and/or receiving RF signals. Specific examples include various types of RF instrumentation, including (but not limited to) RF vector signal analyzers, RF vector signal generators, RF vector signal transceivers, RF signal generators, and RF vector network analyzers. RF instrumentation is classically used for test, measurement, and design of various types of RF hardware. Further exemplary device contemplated include RF devices that are used in a wide variety of non-test-related wireless applications, e.g., (but are not limited to) cognitive radio, base stations for mobile wireless communications, RF user equipment emulation, RF channel modeling, wireless networking, and automatic gain control. Further devices contemplated include RF devices that have a software-defined radio architecture. Software-defined radios are RF devices that have more of their signal path components implemented in software, rather than in hardware. Software-defined radios have a flexible architecture that lends itself very well to various embedded applications, including many of the non-test-related example applications listed above.

When applied specifically to RF devices, the present techniques may make it possible for the custom IP to interface with all of the basic elements of the RF signal path within the programmable hardware element. This may include (but is not limited to) interface blocks that are used for calibration, frequency shift, phase offset, decimation, interpolation, digital gain, data triggering, read/write to onboard memory, read/write to host DMA FIFO, and/or read/write to digital I/O, among others. Access to these interface blocks may allow the custom IP to extend the RF device capabilities in many specific ways, including, for example, (but not limited to) accelerated standard RF measurements (such as instantaneous and average input power calculation, frequency domain and spectral analysis, modulation accuracy analysis, and time-domain analysis), in-line signal processing (such as digital pre-distortion, gain and offset correction, phase balancing, additive noise, and digital filtering), data reduction (such as time domain or frequency domain decimation), custom triggering (such as frequency mask triggers or combinatorial triggers), closed-loop processing and control (such as RF power serving), as discussed below.

As noted above, in some embodiments, the techniques disclosed may be limited to being used from within a unified (or integrated) high-level system design environment, which has common design software that is used both for the components that run on the host and the components that run on the programmable hardware element (of the programmable measurement device). Examples of such a high-level system design environment may include (but are not limited to) a graphical system design tool or a high-level programming language which incorporates high-level synthesis techniques. This unified system design environment allows the user to use the same tool to program both the software that runs on the host and the software that runs on the programmable hardware element. This common system design environment provides the user with novel software design integration between the host processor (e.g., CPU) and the programmable hardware element on the device, which may afford users significantly increased productivity in building their application. Some system design environments may even provide a common high-level programming language that can be used to write code for the host device and for the programmable hardware element (of the programmable measurement device). The user may use the high-level programming language to provide a high-level specification of their program design both for the host and for the programmable hardware element. Then, by using high-level synthesis techniques, the system design environment may analyze the device program source code and generate the appropriate hardware function blocks for the components that run on the programmable hardware element. The same system design environment may also compile the host program source code into the appropriate instruction code for the components that run on the host device.

In some embodiments, one or more of the user application, the standard device driver, the driver IP, the custom IP, or the custom IP interface, may be implemented by a graphical program (or multiple graphical programs), e.g., a graphical data flow program, such as a LabVIEW™ graphical program.

The graphical program may be created on the computer system 82 (or on a different computer system). The graphical program may be created or assembled by the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons which visually indicates the functionality of the program. As noted above, the graphical program may comprise a block diagram and may also include a user interface portion or front panel portion. Where the graphical program includes a user interface portion, the user may optionally assemble the user interface on the display. As one example, the user may use the LabVIEW graphical programming development environment to create the graphical program.

In an alternate embodiment, the graphical program may be created in 902 by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired. The graphical program may implement a measurement function that is desired to be performed by the instrument.

Figure 11A:
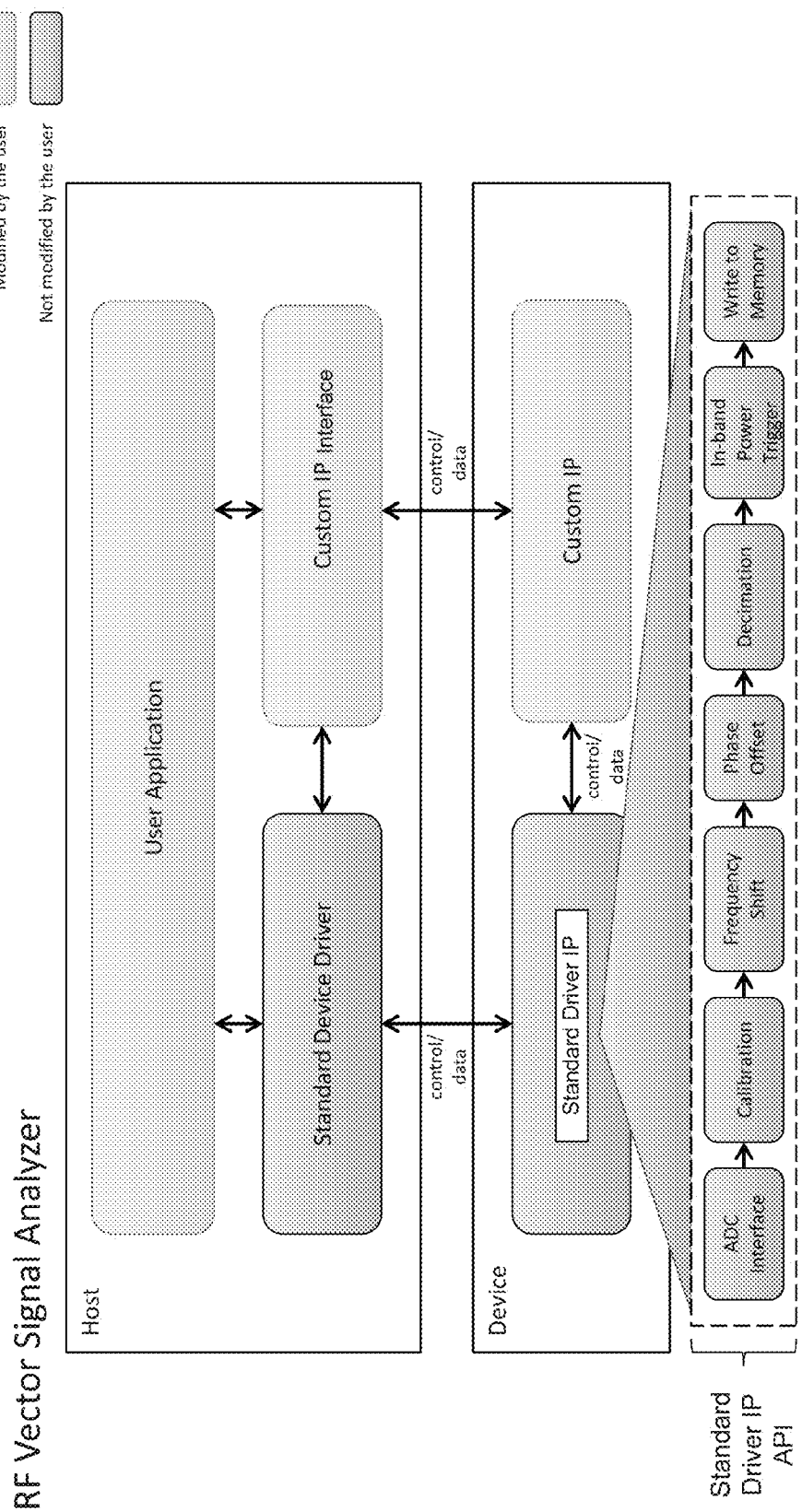
Figure 11C:
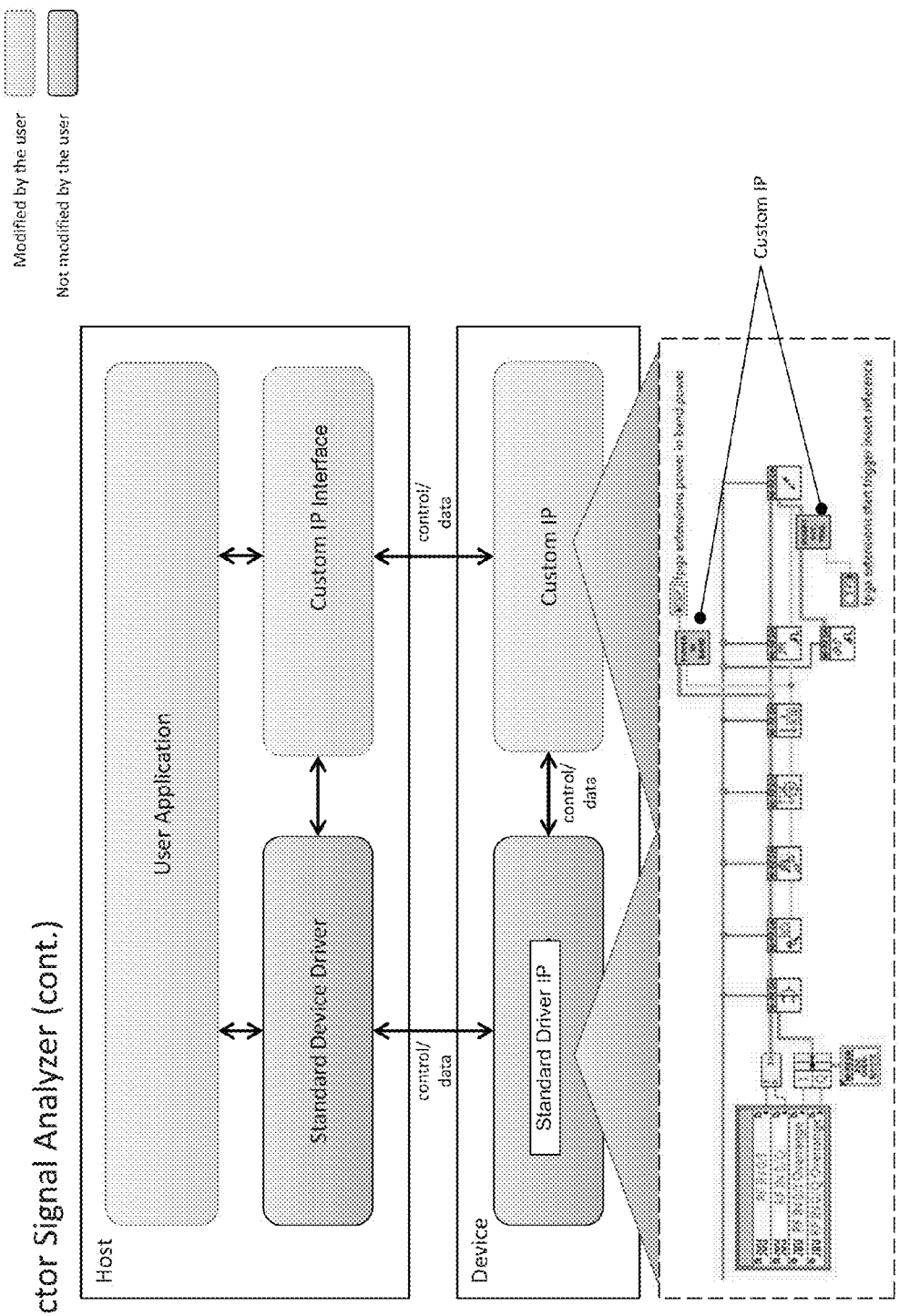

FIGS. 11A-11C—Device Example: RF Vector Signal Analyzer

FIGS. 11A-11C illustrate exemplary implementations of the present techniques in a system that includes an RF Vector Signal Analyzer, according to one embodiment. The standard driver IP implements support for all of the basic functions needed within a RF VSA. As indicated in FIG. 11A, these basic functions implement functionality such as, for example, reading raw data from an analog to digital converter (ADC), calibrating the data, digitally downconverting the data, detecting signal content within a certain power band, or storing the data to onboard memory within the device, among others, as shown in the bottom row of exemplary driver IP elements or components labeled "standard driver IP API", specifically, "ADC Interface", "Calibration", "Frequency Shift", "Phase Offset", "Decimation", "In-band Power Trigger", and "Write to Memory".

The custom IP may access each of these basic functions via the standard driver IP API. In other words, the custom IP may have full access to the data at each of the different places along the signal chain (between each of these components or blocks shown in the bottom row of the Figure). This may allow the custom IP to extend or augment the device capabilities in many interesting ways. For example, the custom IP may implement an in-band power measurement by simply analyzing the data right after the decimation block. The custom IP could also replace one of these blocks with a custom implementation that is more optimal for a specific application (but may still preserve the original functionality of the API).

Note that none of these blocks need to be modified in order to achieve this customization. Furthermore, standard device driver functionality is maintained.

As noted above, in some embodiments, the present techniques may be at least partially implemented using graphical programs. FIG. 11B illustrates an example of how an exemplary implementation of the standard driver IP API may appear in a graphical programming language such as National Instruments Corporation's LabVIEW™. As shown, there are API blocks for each of the basic functions of an RF vector signal analyzer. Note that although a graphical programming language is very useful, it is not required to implement the techniques disclosed herein.

The user application may invoke each of these API blocks in the user's top-level design/program. This allows the user's custom IP to directly access data and control signals at each place along the full signal path. Thus, these graphical program nodes may be considered to be the components of the standard driver IP API.

FIG. 11C illustrates incorporation of custom IP into the system of FIGS. 11A and 11B, i.e., illustrates an example of using custom IP with the (programmable) device's standard driver IP API, as indicated by the "Power In Band" and "Insert Ref. Trig." nodes. This particular example uses a graphical programming language such as LabVIEW™. Here, it is shown how the user can combine usage of the standard driver IP API with their custom IP to enhance the device capabilities.

In this particular example, the custom IP taps into certain places within the signal path of the API graphical program to perform custom RF measurements. The result of these measurements is communicated directly to the custom IP component running on the host device.

Again, no modifications were made to the standard driver IP or standard device driver, and all device driver functionality continues to operate properly.

Exemplary Applications

The following present various exemplary applications of the above techniques in different technological domains, although it should be noted that the examples disclosed are exemplary only, and are not intended to limit the applicability of the techniques to any particular domain or application. Some aspects of the various embodiments described remain the same from example to example, but are nevertheless described in each case for modularity and easy reference by the reader. Note that the particular names of elements or components shown are exemplary only and meant to be descriptive, and that any other names may be used as desired.

Figure 12A:
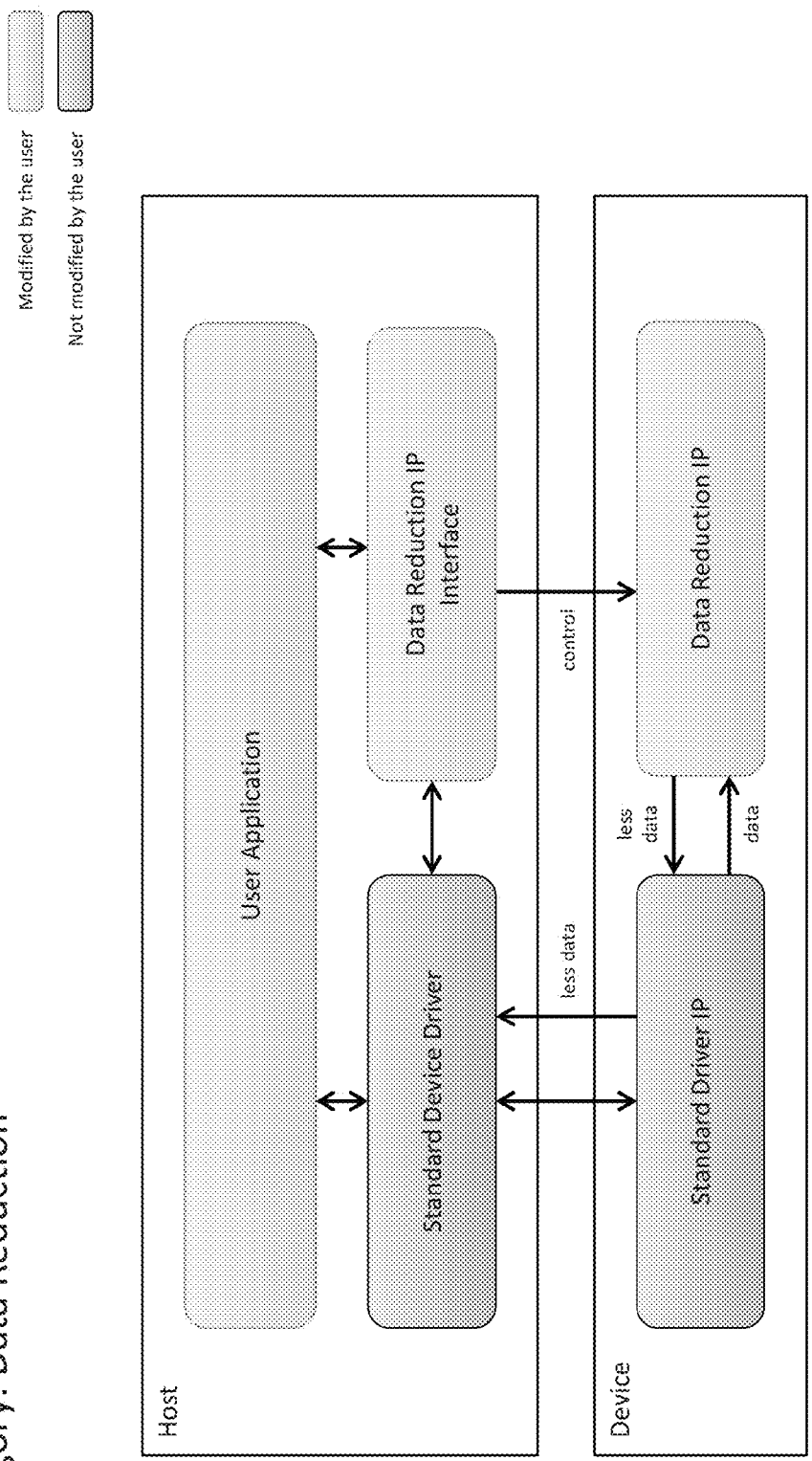
FIGS. 12A-12C illustrate exemplary implementations of the present techniques in a system directed to data reduction, according to one embodiment.
Figure 12B:
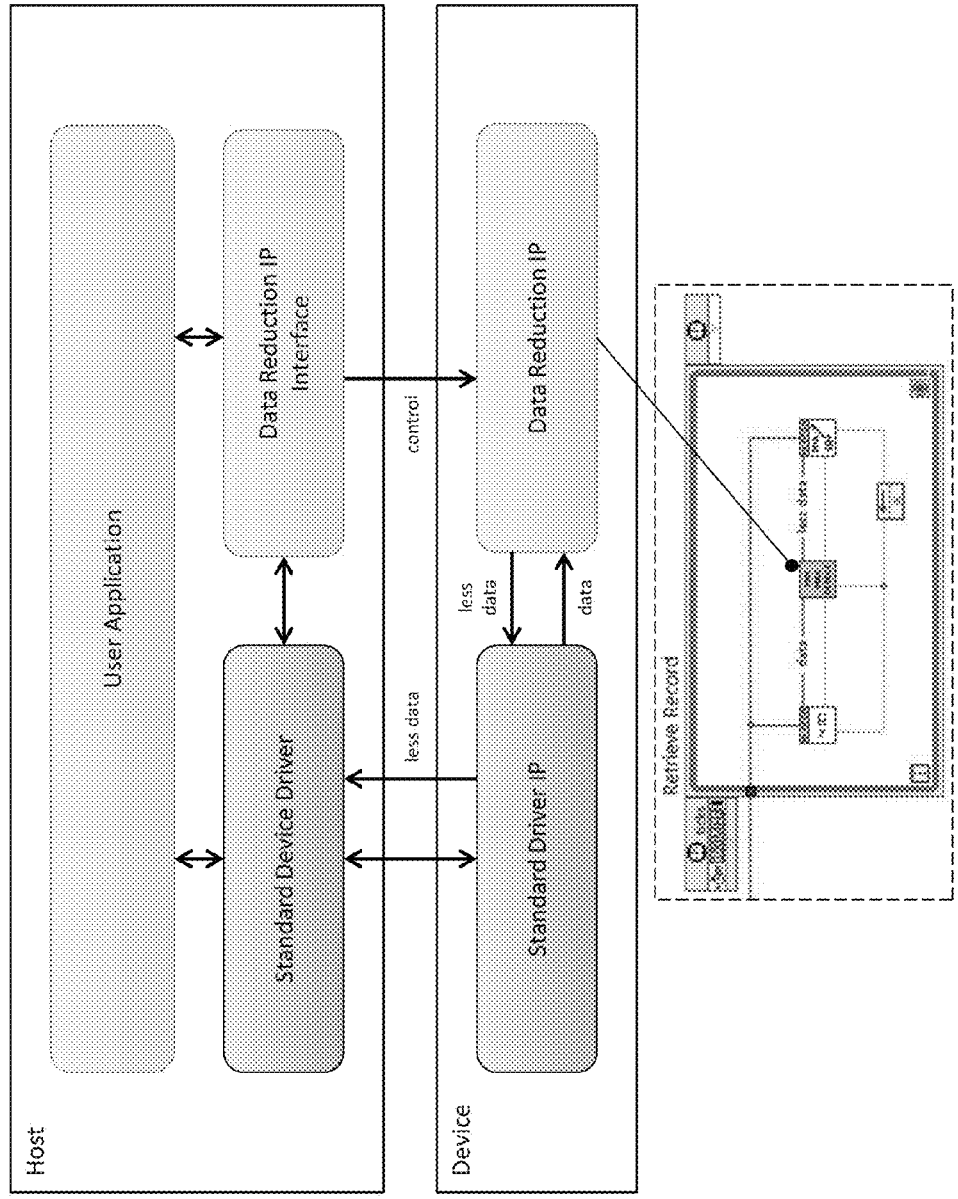
Figure 12C:
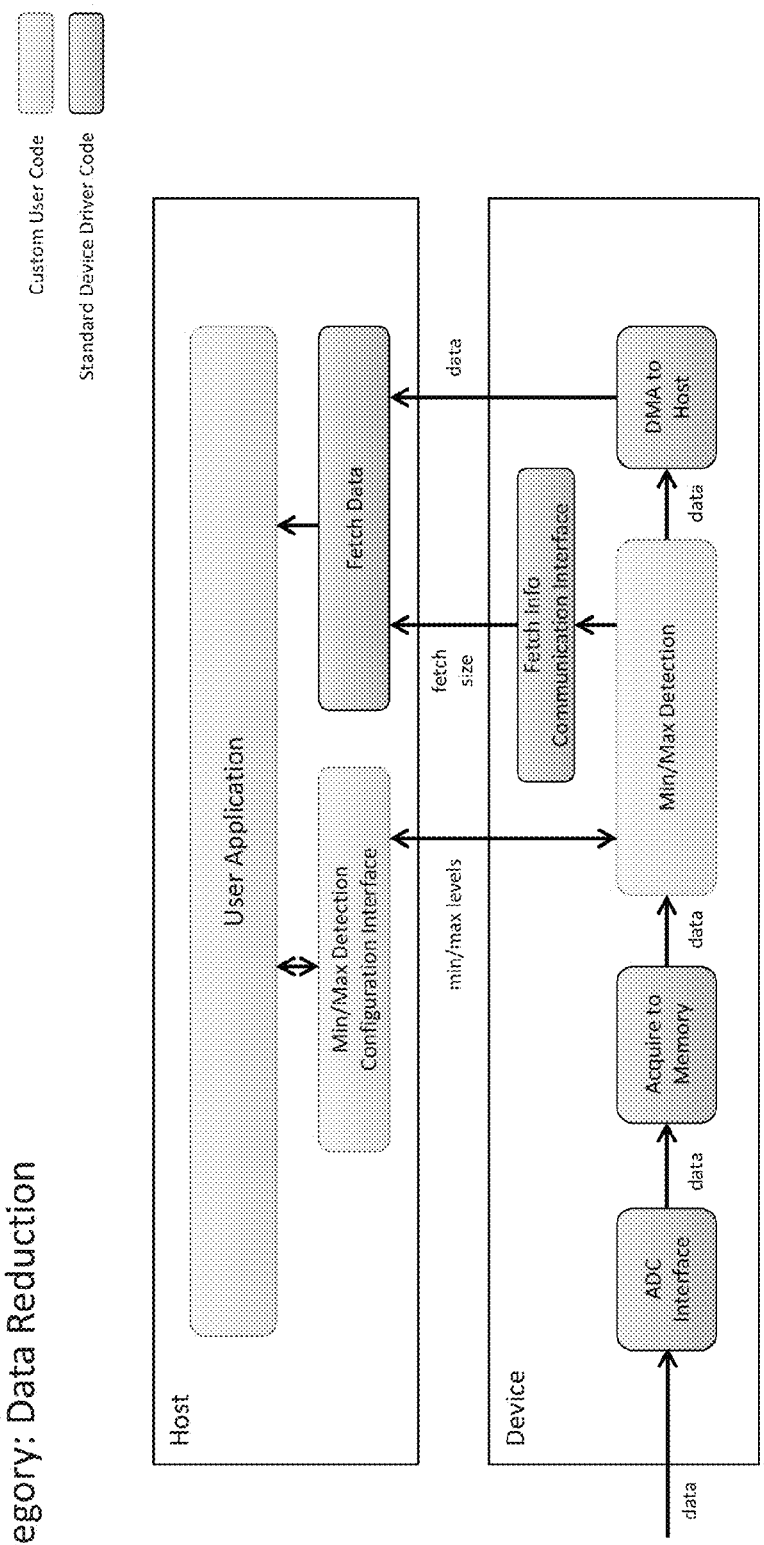

FIGS. 12A-12C—Data Reduction

In some embodiments, the custom IP may be configured to perform data reduction on data received by the programmable measurement device, thereby reducing the amount of data provided to the standard driver IP for provision to the standard device driver. FIGS. 12A-12B illustrate exemplary implementations of the present techniques in a system directed to data reduction, according to one embodiment.

Data reduction applications often exploit the processing capabilities found in device driver IP targets, commonly field-programmable gate arrays, which offer a high degree of computational parallelism. These applications select the application-relevant data from a larger data set, and send it to the host processor (e.g., microprocessor) for additional analysis and/or storage. By performing the data reduction in the device driver IP, less data is transferred between the device and host, resulting in decreased transfer latency or more efficient host-device link utilization, and the host processor need not process as much data, resulting in decreased application execution time or a greater system throughput (in terms of pre-reduced data).

An example of data reduction is time domain decimation, where device events determine when data is and is not allowed to pass to the host. These events may be based on the nature of the data itself, otherwise computed within the (custom) data reduction IP (e.g., a counter signal), or may be external events from the standard driver IP, the device hardware, or a signal external to the device. Another example of data reduction is frequency domain decimation, where only a specific frequency band or multiple smaller bands are selected from a broadband signal, commonly implemented in digital downconverters and channelizers.

FIG. 12A shows that in this exemplary application, both the custom IP interface and the custom IP are specifically directed to data reduction, with control signals transmitted from the (custom) data reduction IP interface to the (custom) data reduction IP, and "less data" (i.e., reduced data) transmitted from the data reduction IP to the data reduction IP interface, e.g., for provision to or use by the user application. In other words, in the embodiment shown, in response to the control signals, the custom (data reduction) IP may reduce data and send the reduced (less) data to the host side user application via the custom (data reduction) IP interface, as shown.

FIG. 12B illustrates insertion of the custom IP, specifically, the (custom) data reduction IP into a graphical program implementing the standard driver IP for the programmable measurement device, where the graphical program includes various interconnected nodes related to RF functionality of the device as indicated by their respective icons, including min/max detect and DMA nodes, among others.

FIG. 12C shows more details regarding how a certain type of data reduction block may be built, according to one embodiment. In this exemplary case, the user has added a custom block that computes minimum and maximum values from the acquired data in a digitizer instrument. For every N samples, a min/max detection block, so labeled, computes the minimum and maximum values of the data set and outputs only those values. Therefore, the number of samples that are written to the DMA to host block, so indicated, are fewer than the number of samples that are received from the acquire to memory block shown. This use case is particularly useful for accelerating the detection of fluctuations in a signal, such as monitoring a power rail for power spikes.

An important point of this exemplary case is that the user can add the custom min/max detection block without causing any changes to how the user application interacts with the standard device driver on the host. A fetch data function, so labeled, which is part of the standard device driver API, continues to operate properly and is able to adjust its behavior to read a reduced quantity of data from the device than what it would otherwise expect. In other words, the standard device driver API contract on the host is preserved, which allows the user application to continue functioning while still using the standard driver API.

The standard driver IP on the programmable hardware element (e.g., FPGA) provides a fetch info communication interface, which is implemented via registers. This interface allows the custom min/max detection block to advertise the fetch size to the standard device driver on the host. The standard device driver reads this advertised fetch size information to determine how many samples to read from the DMA to host block. Additionally, the operation of the custom min/max detection block is configured via custom user code on the host (the min/max detection configuration interface). This configuration is what ultimately defines the data reduction factor (and thus the fetch size).

Figure 13A:
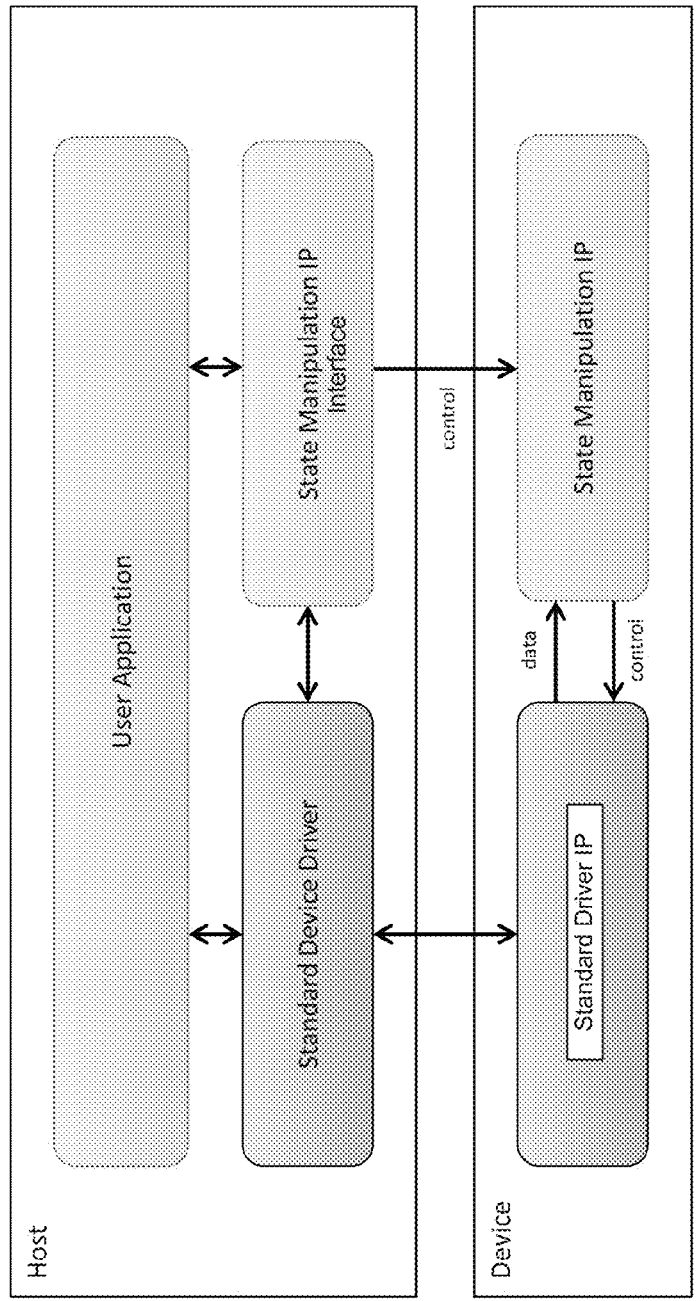
FIGS. 13A-13C illustrate exemplary implementations of the present techniques in a system directed to device state manipulation, according to one embodiment.
Figure 13B:
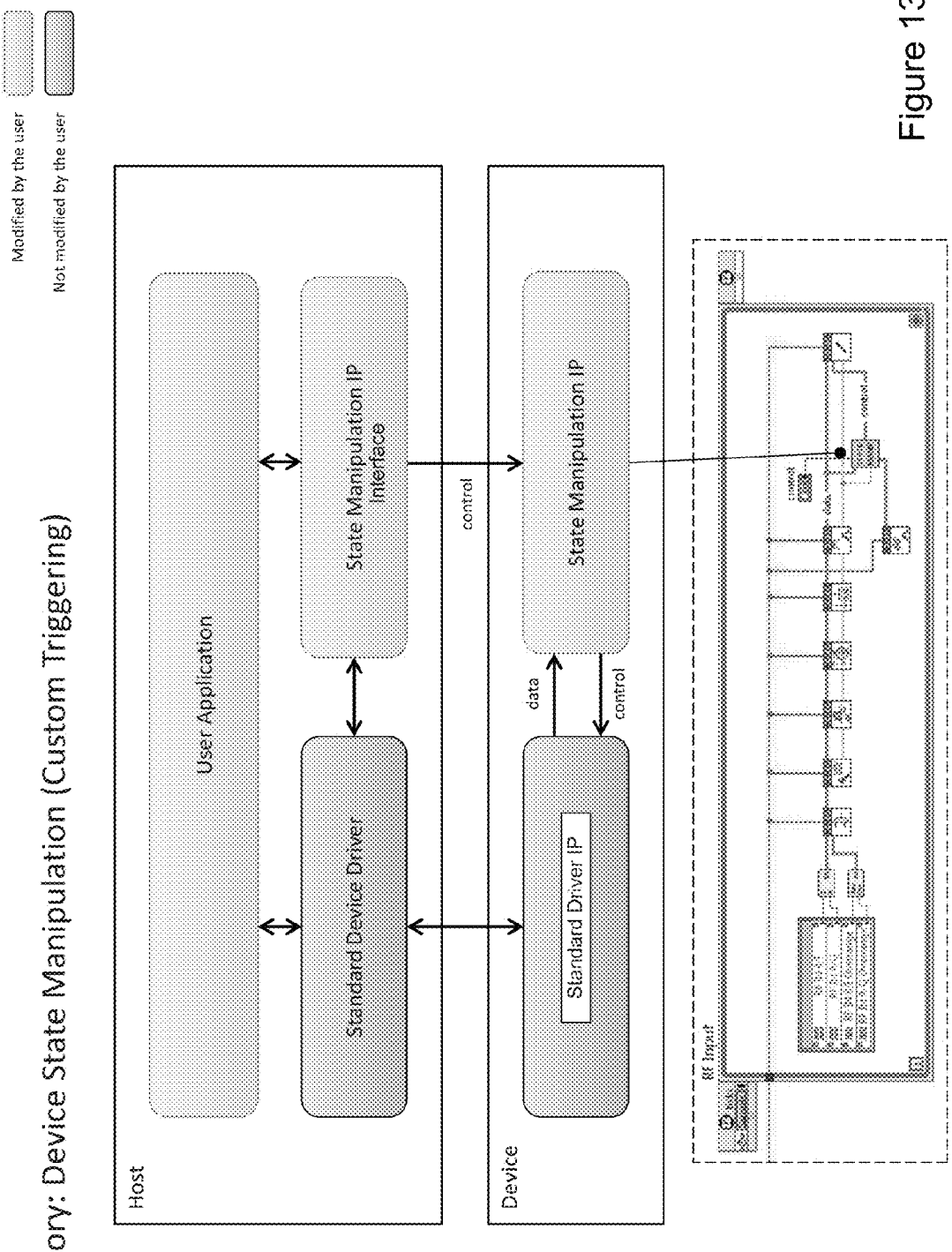

FIGS. 13A-13B—Device State Manipulation

Figure 13C:
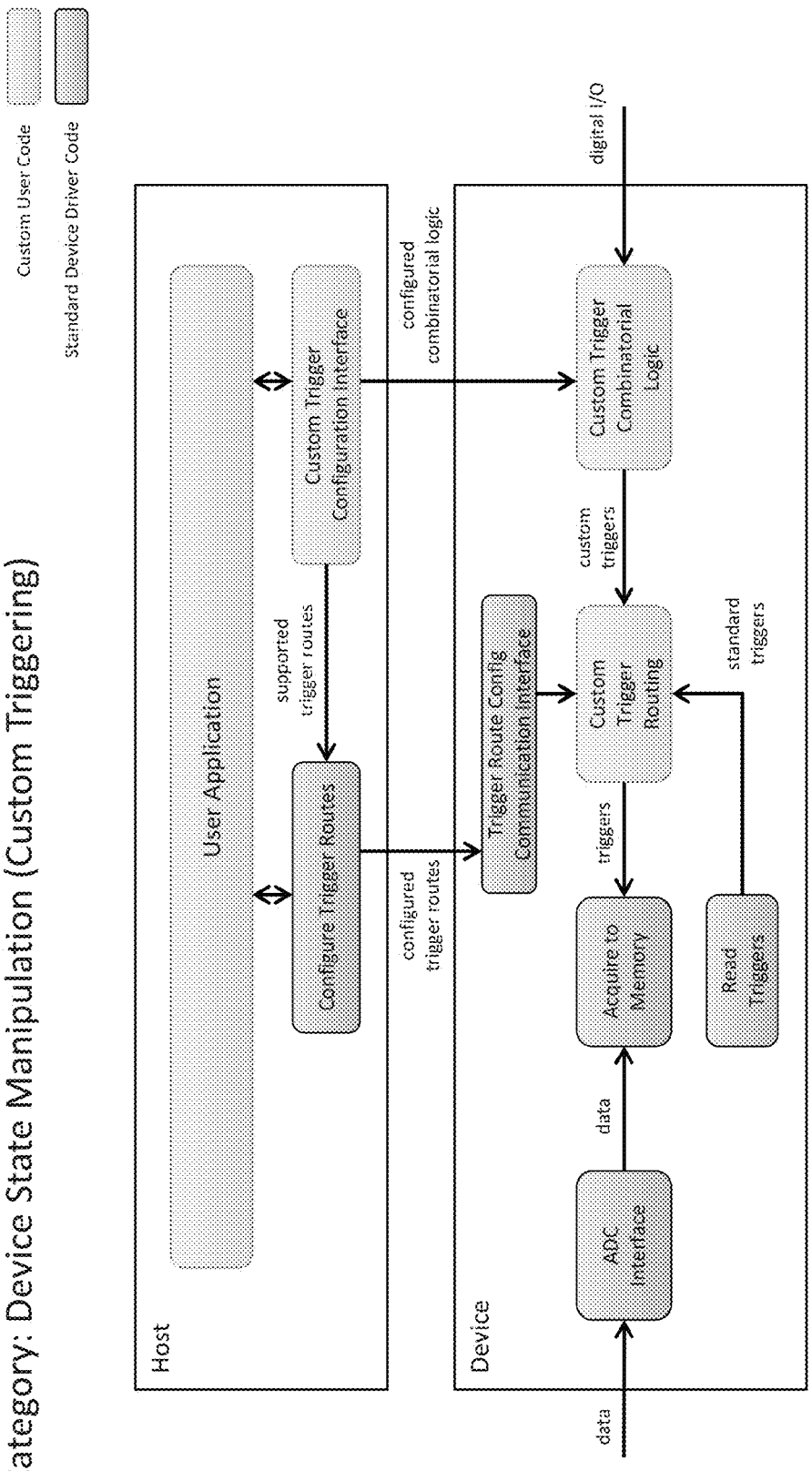

In some embodiments, the custom IP may be configured to perform device state manipulation of the programmable measurement device, e.g., for custom triggering. FIGS. 13A-13C illustrate exemplary implementations of the present techniques in a system directed to device state manipulation (custom triggering), according to one embodiment.

State manipulation applications may exploit the low-latency decision-making capabilities found in device driver IP targets, commonly field-programmable gate arrays. Implementing such processing in the device driver IP, e.g., adjacent to the standard driver IP, may further reduce latency as compared with this same logic executing on the host processor (e.g., microprocessor) which incurs a minimum of two transactions over the host-device communication link. Furthermore, when coupled with the computational capabilities of an FPGA or other programmable hardware element, more advanced forms of data-based state manipulation can be achieved, which are not possible given the computational capability of the host processor.

As with the above examples, in the embodiment illustrated in FIG. 13A, the custom IP interface and custom IP are each specifically directed to device state manipulation, per their designations as "State Manipulation IP Interface" and "State Manipulation IP". As shown, control signals are transmitted from the (custom) statement manipulation IP interface (e.g., in response to execution of the user application), and the (custom) state manipulation IP sends corresponding control signals to the standard driver IP, and receives data back in response.

FIG. 13B illustrates insertion of the state manipulation IP into a graphical program implementing the standard driver IP API, in the form of a graphical program node labeled "STATE MANIP".

Examples of device state manipulation include all forms of custom triggering for both acquisition and generation. Data-based triggers process incoming data and determine when to initiate data capture, such as a frequency mask trigger which performs a frequency domain transform (usually a fast Fourier transform (FFT)) followed by a mask threshold comparison, generating a trigger upon a mask exception. These are related to data reduction applications, but differ in that they gate data through standard mechanisms found in the standard driver IP and standard device driver, rather than through an independent data link to the user host application through the custom host IP. Other forms of custom triggering include combinatorial logic triggers, combining one or more events or signals from the standard driver IP, the state manipulation IP (e.g., a counter signal), the device hardware, or a signal external to the device.

FIG. 13C shows more details regarding how a certain type of device state manipulation may be built, according to one embodiment. In this exemplary case, the user has added the ability to perform custom combinatorial logic on digital I/O signals and use the result to trigger the data acquisition block in the standard driver IP.

As indicated, the user has added a custom trigger combinatorial logic block, so labeled, that can perform various types of combinatorial logic on digital I/O lines. The results of these combinatorial logic operations are fed into a custom trigger routing block, so indicated, that can route specific triggers to the data acquisition logic in an acquire to memory block, labeled thusly. This custom trigger routing block is configured to select between the custom triggers and the standard triggers that are provided by the standard driver IP. This allows the system to preserve standard triggering capabilities but still extend the device to support custom triggers. The standard device driver on the host provides a configure trigger routes API function as shown which allows the user application to route trigger signals properly.

An important point illustrated by this exemplary case is that the user can integrate their custom trigger routing block into the standard configure trigger routes API, thereby avoiding any changes regarding how the user application configures trigger routes on the standard device driver. The configure trigger routes function, which is part of the standard device driver API, continues to operate properly and is able to route the new custom trigger signals properly. In other words, the standard device driver API contract on the host is preserved, which allows the user application to continue functioning while still using the standard driver API.

As also indicated, the standard driver IP on the programmable hardware element (e.g., FPGA) provides a trigger route config communication interface, which is implemented via registers. This interface allows the standard device driver on the host to configure the signal routing logic inside the custom trigger routing block (as part of the configure trigger routes function). Additionally, the custom trigger configuration interface may advertise to the standard device driver which trigger routes are supported within the custom trigger routing block. The standard device driver uses this advertised set of trigger routes to determine the available routes and how to configure them. Furthermore, the custom trigger configuration interface allows the user application to configure the triggering combinatorial logic on the custom trigger combinatorial logic block.

Figure 14A:
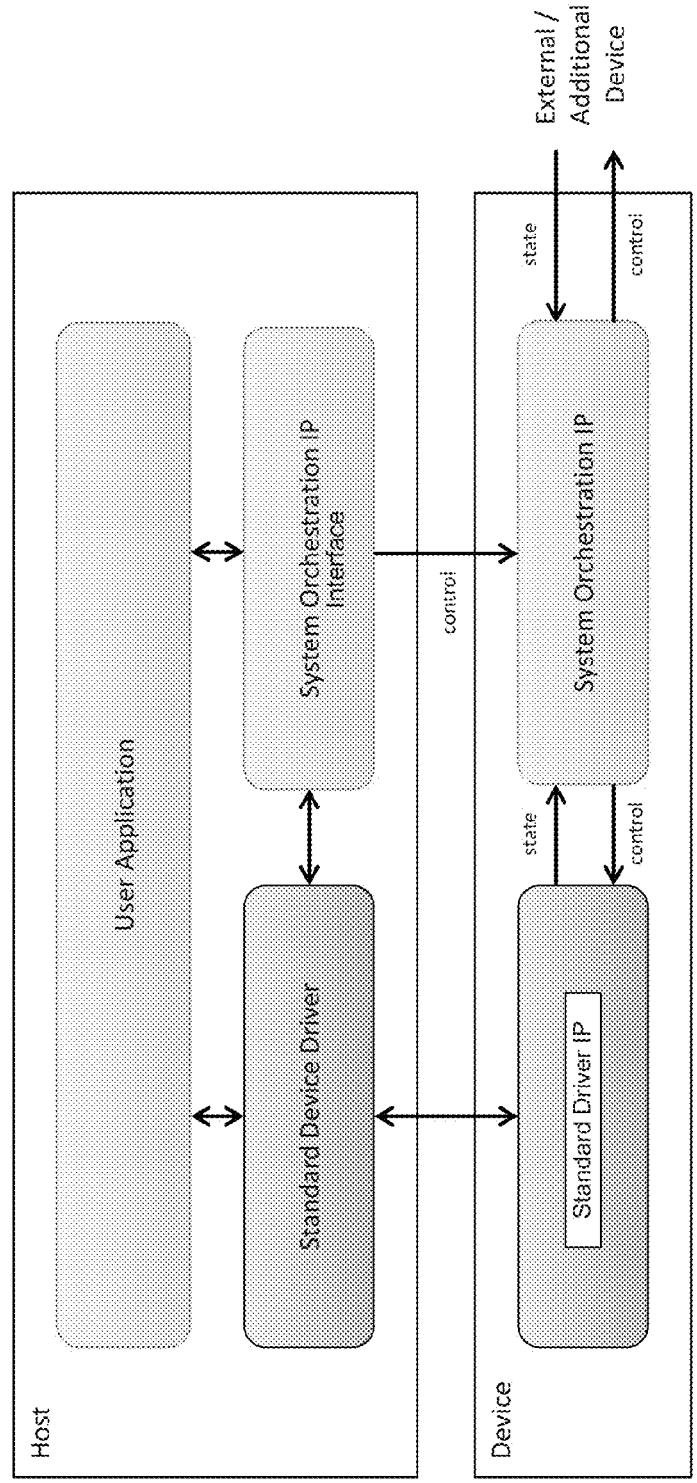
FIGS. 14A-14B illustrate exemplary implementations of the present techniques in a system directed to multi-device orchestration, according to one embodiment.
Figure 14B:
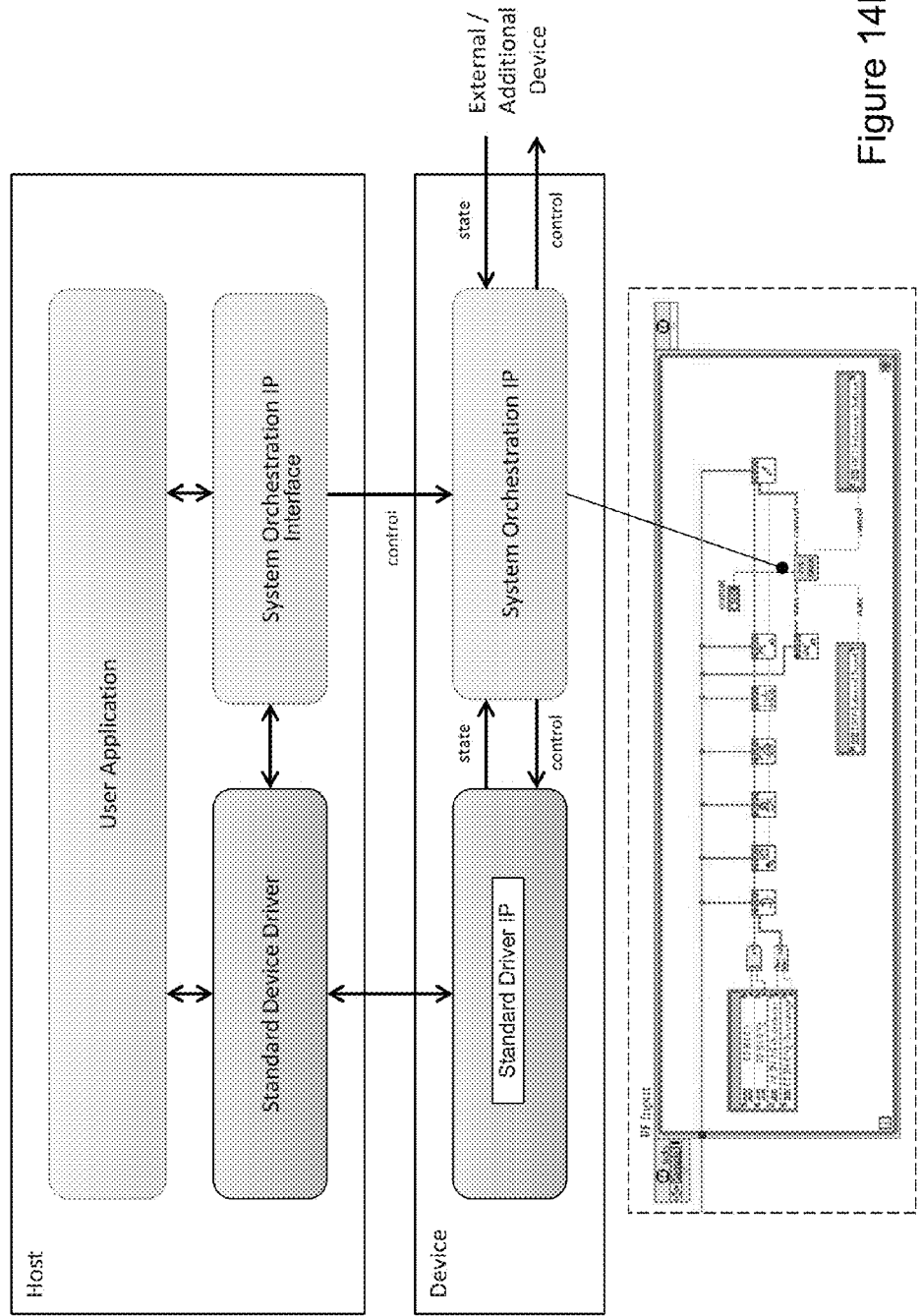

FIGS. 14A-14B—Multi-Device Orchestration

In some embodiments, the programmable measurement device may be configured to couple to one or more external (e.g., additional) devices, where the programmable measurement device and the one or more external devices are, include, or are included in, a multi-device system, and where the custom IP is configured to perform multi-device orchestration of the multi-device system. FIGS. 14A-14B illustrate exemplary implementations of the present techniques in a system directed to multi-device orchestration, according to one embodiment.

System orchestration applications may exploit the low-latency decision-making capabilities found in device driver IP targets, commonly field-programmable gate arrays. This reduces event processing latency when compared with this same logic executing on the host processor (e.g., microprocessor). These applications effectively move system-level decision-making (as opposed to device-level) logic into the (master) device driver IP, reducing application latency and decreasing application execution time. Such applications generally require additional communications signals to other devices in the system, along with similar state and control logic accessible on the additional devices, either as standard driver IP or custom IP. In some embodiments specific to automated test applications the additional device may include the device or unit under test (DUT or UUT), provided it, too, includes means for exchanging state and control data with the test system. System orchestration IP is usually used in conjunction with other forms of custom IP, controlling that IP as part of the system.

As FIG. 14A shows, in this exemplary embodiment, control signals are communicated from the (custom) system orchestration IP interface to the (custom) system orchestration IP, which communicates corresponding control signals to the standard driver IP and (one or more) external/additional device(s), and receives state information in response.

FIG. 14B shows an exemplary insertion of the system orchestration IP into the standard driver IP's API in the form of a "SYS ORCH" node inserted into a graphical program implementing the API.

An example of system orchestration in an automated test system is a hardware/device test execution engine, moving the conditional execution usually governed by a microprocessor-based software test executive into a (system master) device driver IP, enabling faster test sequencing and leaving only test-specific results processing and pass/fail criteria evaluation to the microprocessor.

Figure 15A:
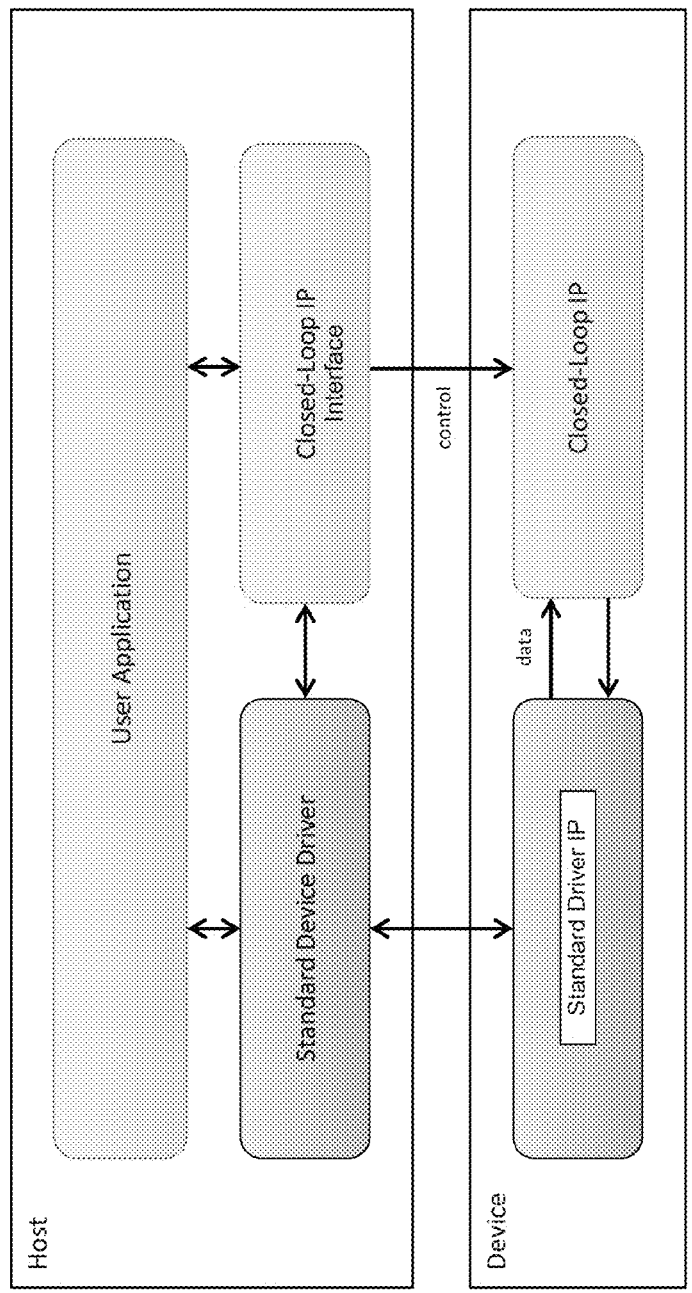
FIGS. 15A-15B illustrate exemplary implementations of the present techniques in a system directed to closed-loop processing and control, according to one embodiment.
Figure 15B:
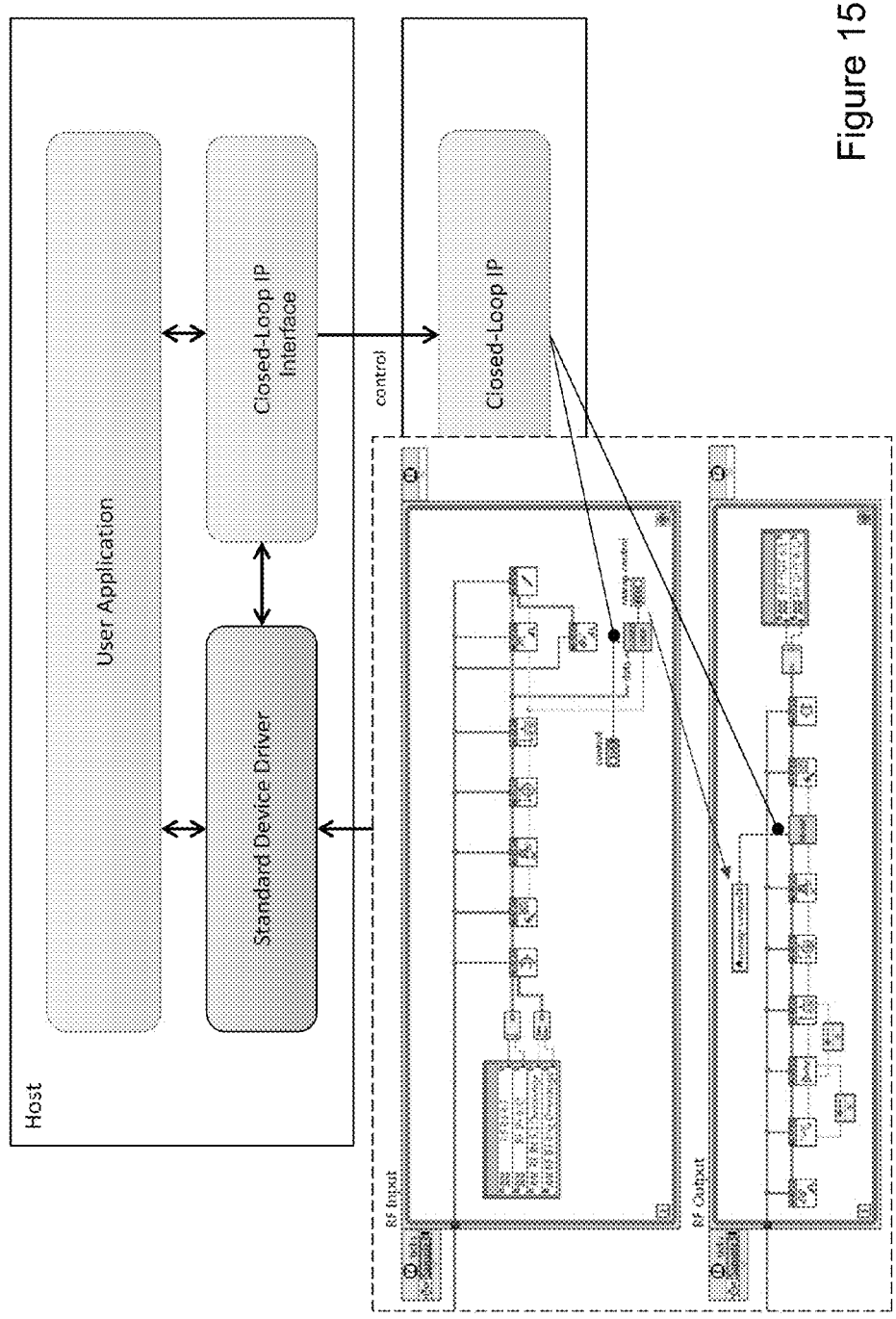

FIGS. 15A-15B—Closed Loop Processing and Control

In some embodiments, the programmable measurement device may be configured to perform closed loop processing and control. To perform closed loop processing and control, the programmable measurement device may be configured to receive data from the standard driver IP, process the data from the standard driver IP, thereby generating processed data, and provide the processed data to the standard driver IP. Note that in various embodiments, the closed loop may be within the programmable measurement device, or may be distributed across multiple devices. Note further that the processing may be any kind of processing desired, e.g., filtering, decimation, unit conversion, and so forth, as desired.

FIGS. 15A-15B illustrate exemplary implementations of the present techniques in a system directed to closed-loop processing and control, according to one embodiment.

Closed-loop applications exploit both the computational and low-latency decision-making capabilities found in device driver IP targets, commonly field-programmable gate arrays. These pertain to devices with both inputs and outputs, and involve processing incoming signals and either outputting the processed signal directly, or controlling a parameter which can manipulate the reference data supplied by the standard driver IP for generation.

Per FIG. 15A, (custom) a host side closed-loop IP interface, labeled so, sends control signals to device side (custom) closed-loop IP, which transmits corresponding control signals or data to the standard driver IP on the programmable measurement device, and receives data from the standard driver IP in response.

FIG. 15B illustrates insertion of the closed-loop IP into the standard driver IP API in the form of a "CLOSED LOOP" function node inserted into an RF Input graphical program, and a "MANIP" function node inserted into an RF Output graphical program, with communication between the graphical programs implemented via a "manip control" terminal.

An example of a closed-loop processing is a channel emulator, where acquired data are impaired such that they emulate the effects of a real-world operating environment and are subsequently re-generated in real-time. This can be useful for performing "field" tests in repeatable laboratory conditions. An example of a closed-loop control application is hardware power servoing for a power amplifier test, in which the amplifier output (device input) is acquired, its power measured, and the amplitude of the amplifier input (device output) scaled until the system converges on a stable amplifier output power set point. This iterative process has historically been performed on a CPU, but can be significantly accelerated by moving it to the device driver IP.

Figure 16A:
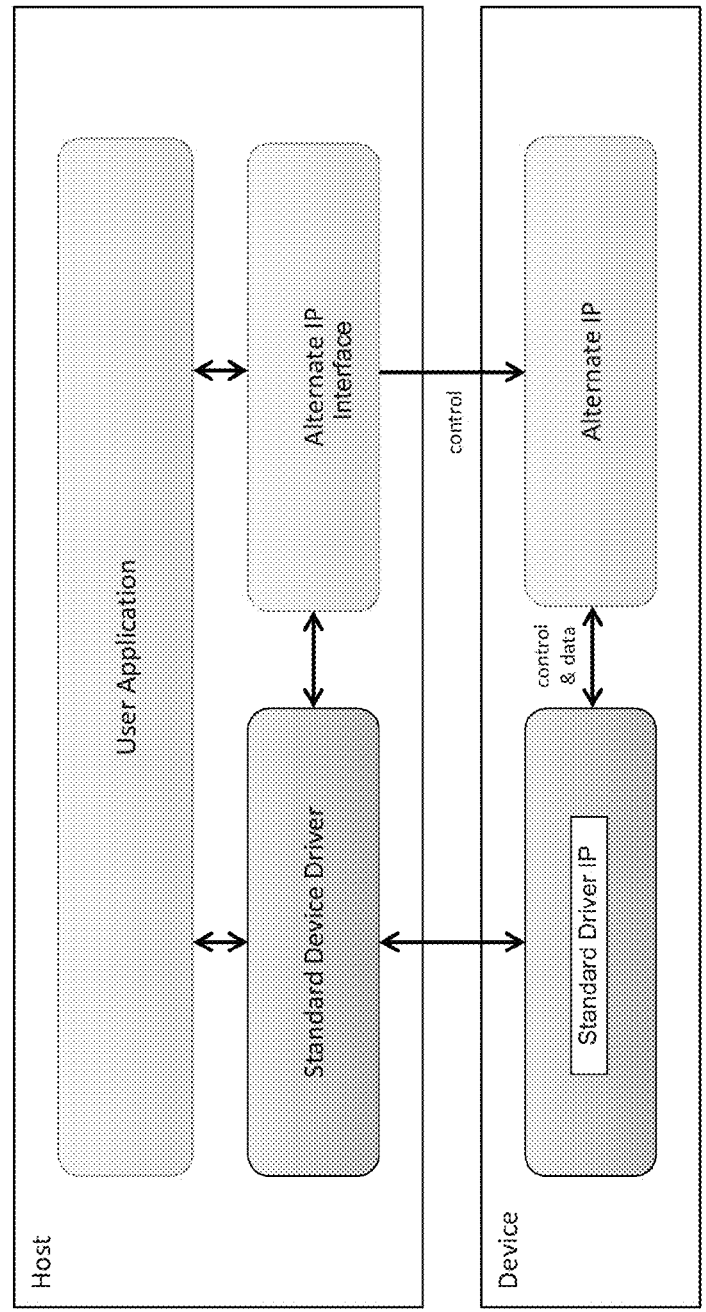
FIGS. 16A-16C illustrate exemplary implementations of the present techniques in a system directed to alternate standard functionality, according to one embodiment.
Figure 16B:
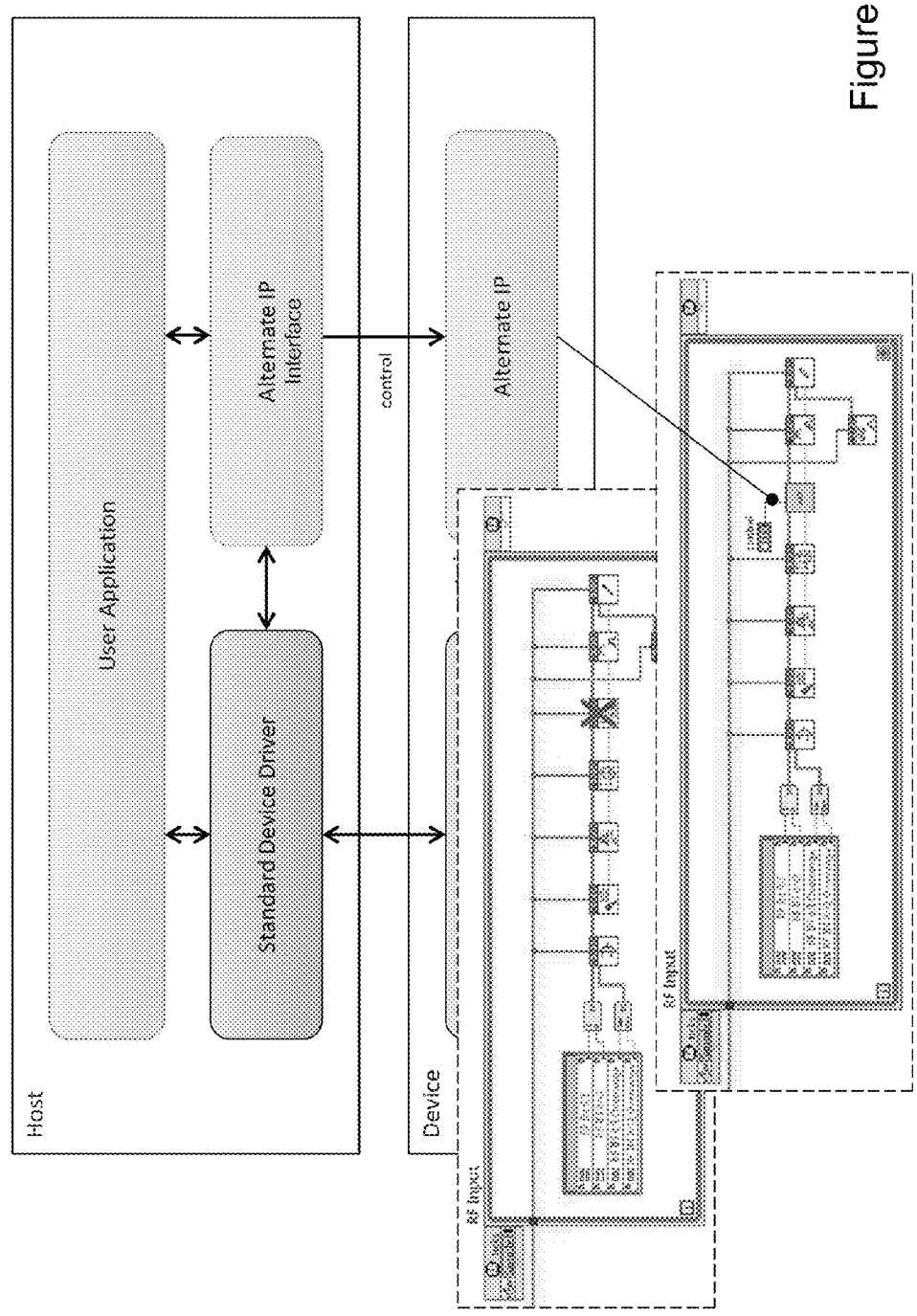
Figure 16C:
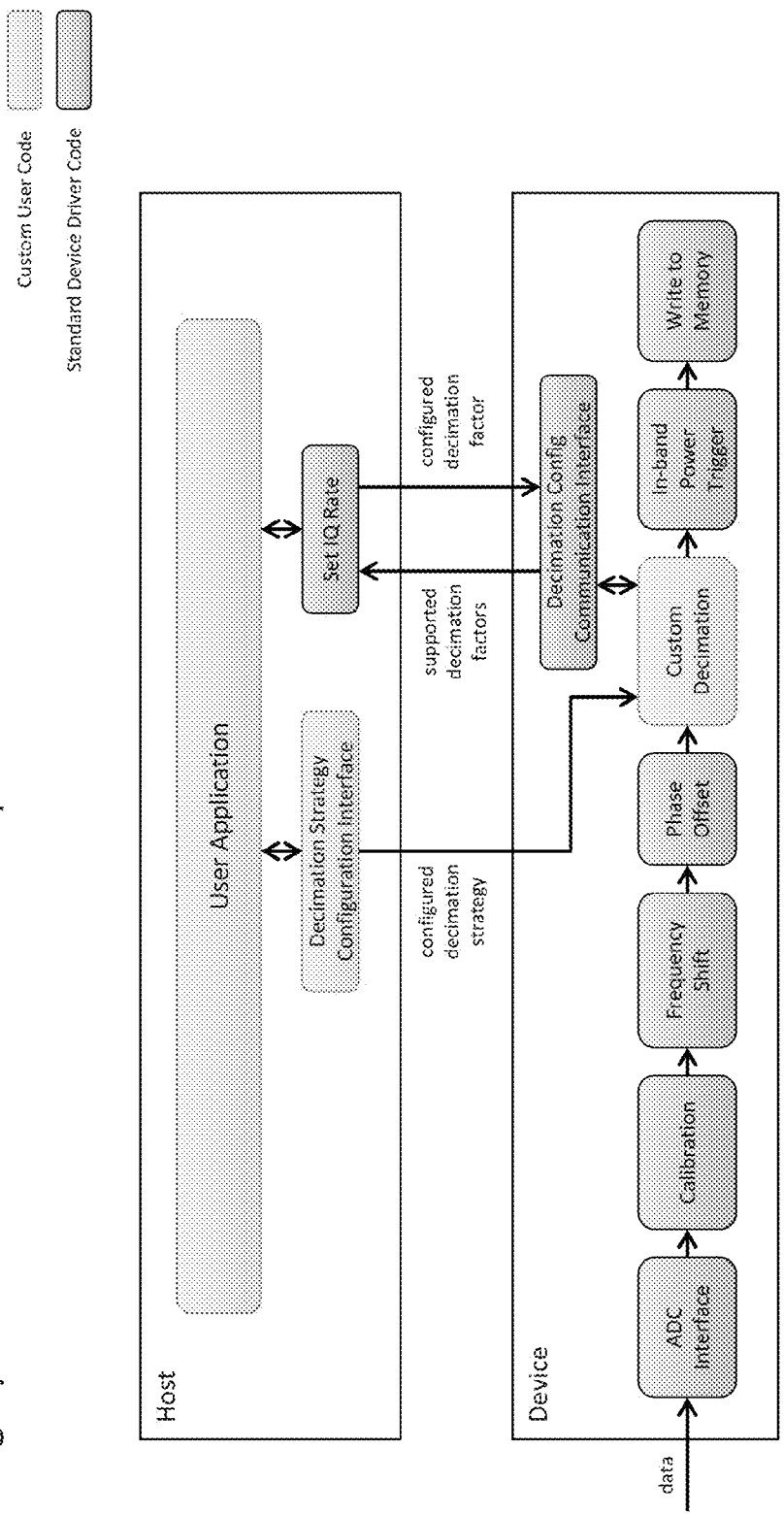

FIGS. 16A-16C—Alternate Standard Functionality

In some embodiments, the custom IP may be configured to provide alternate implementations of standard functionality provided by the standard driver IP and standard device driver. FIGS. 16A-16C illustrate exemplary implementations of the present techniques in a system directed to alternate standard functionality, according to one embodiment.

Alternate standard functionality implementations replace functionality implemented in the standard driver IP with custom functionality. This may be done to enhance the feature set or performance of the standard driver IP, or replace it with an implementation which consumes fewer driver IP resources, e.g., which may only implement a subset of the complete standard driver IP functionality, e.g., the minimum set required by the user application. The latter may be desirable when additional custom IP requires greater driver IP resources than those not consumed by the default standard driver IP.

As FIG. 16A shows, in this exemplary embodiment, control signals may be communicated between a (custom) alternate (standard functionality) IP interface on the host device and (custom) alternate (standard functionality) IP on the programmable measurement device, and corresponding control signals and data may correspondingly be communicated between the alternate (standard functionality) IP and the standard driver IP.

FIG. 16B illustrates insertion of the alternate IP into the driver IP API in the form of an "ALT" function node inserted into a graphical program implementing the standard driver IP API, which in this case is directed to RF input functionality, including various function nodes for MUX, alarm, scaling, trigger, and write functions, among others. However, in this embodiment, the inserted node replaces the corresponding function node in the graphical program, as indicated by the "X'ed" node.

One example of alternate IP may replace vendor-provided, more versatile and parameterizable, digital signal processing (DSP) found in the standard driver IP with an implementation that only supports a single fixed configuration, but consumes fewer driver IP resources.

FIG. 16C shows more details regarding how a certain type of alternate standard functionality may be built. In this case, the user has replaced the standard decimation block with a custom decimation block in their RF instrument. The custom decimation block might be more optimized to the user's specific application (which only requires certain decimation factors). For example, the custom decimator may only support a limited set of integral decimation factors, rather than the full range of fractional decimation factors. In return, the custom decimation block requires fewer programmable hardware element (e.g., FPGA) resources to implement, thereby freeing additional space for more custom user IP.

An important point illustrated by this exemplary case is that the user can replace the standard decimator with their custom decimation block without causing any changes to how the user application interacts with the standard device driver on the host. For example, a set IQ rate function, which is part of the standard device driver API, continues to operate properly and is able to configure the new custom decimation block. In other words, the standard device driver API contract on the host is preserved, which allows the user application to continue functioning while still using the standard driver API.

As also shown, the standard driver IP on the programmable hardware element (e.g., FPGA) provides a decimation config communication interface, which is implemented via registers. This interface allows the custom decimation block to advertise the decimation factors that it supports to the standard device driver on the host. The standard device driver reads this advertised set of decimation factors to determine the valid set of IQ rate values. This interface also allows the standard device driver on the host to configure the decimation factor on the custom decimation block (as part of the set IQ rate API). The decimation factor is calculated based upon the desired IQ rate.

Furthermore, the custom decimation block may actually support multiple different types of decimation strategies (where each decimation strategy may have a unique set of supported decimation factors). For example, one strategy might be designed for low bandwidth with high resolution, and another strategy might be designed for high bandwidth with lower resolution. The user application may dynamically switch between these strategies based upon which RF signal path is currently in use. The custom decimation IP may provide a decimation strategy configuration interface on the host which allows the user application to configure the decimation strategy. In this way, the user application can use custom IP to extend the capabilities of the device while still leveraging existing standard device driver *APIs* to configure the custom IP.

Figure 17:
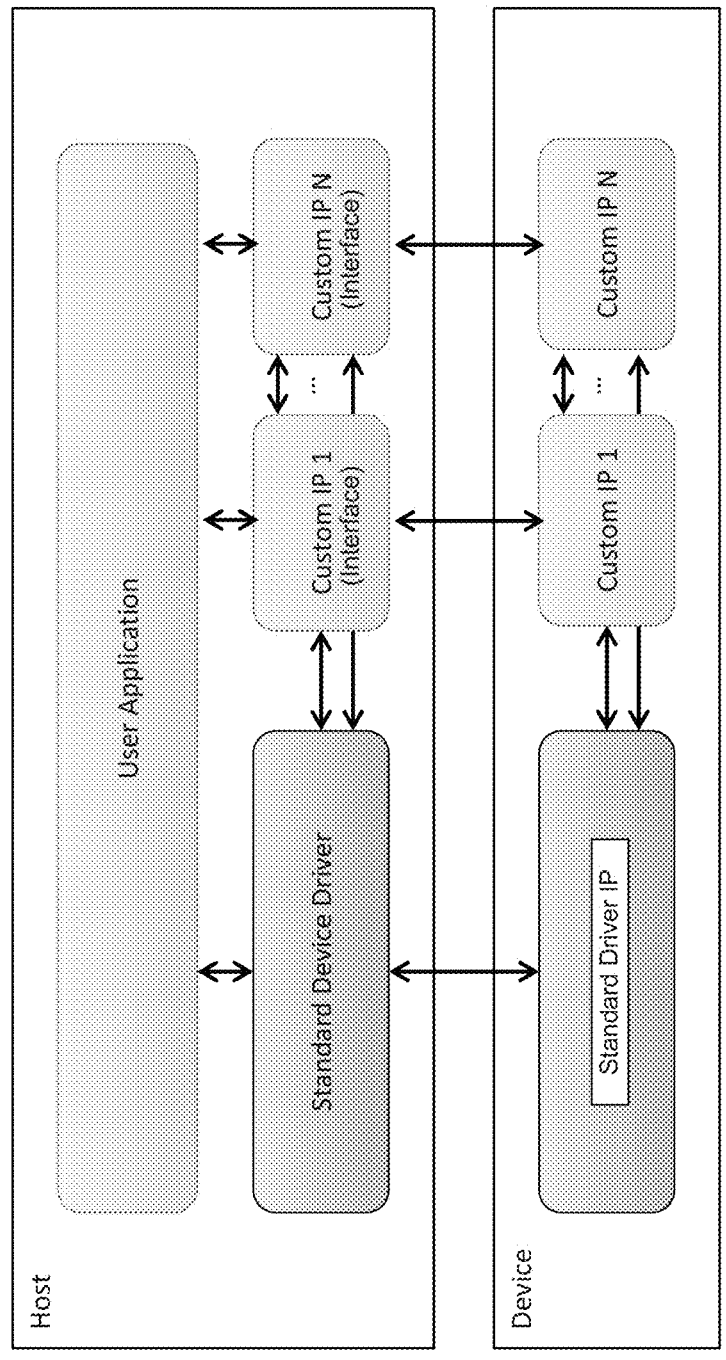
FIG. 17 illustrates an exemplary implementation of the present techniques in a hybrid system, according to one embodiment.

FIG. 17—Hybrid Systems

FIG. 17 illustrates an exemplary implementation of the present techniques in a hybrid system, according to one embodiment.

Hybrid systems may include one or more of the above implementations, and/or one or more additional implementations, as desired. As FIG. 17 illustrates, a plurality of different custom IP interfaces may be included on the host, each configured to communicate with a user application, the standard device driver, and possibly each other. Correspondingly, a plurality of respective custom IPs may be implemented on the programmable measurement device, each configured to communicate with the device's standard driver IP, the corresponding custom IP interface, and possibly each other.

It should be noted that this (hybrid) architecture scales, and that any type and number of implementations may coexist within the device driver IP size limitations.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A non-transitory computer accessible memory medium that stores program instructions executable by a processor to perform:
   receiving first user input specifying custom IP (intellectual property) for a programmable measurement device, wherein the programmable measurement device includes:
      a programmable hardware element; and
      standard driver IP provided by a vendor of the programmable measurement device, wherein the standard driver IP is configured to operate in conjunction with a standard device driver for the programmable measurement device that is provided by a vendor of the standard device driver and is resident on a host device configured to couple to the programmable measurement device for operation of the programmable measurement device; and
   generating the custom IP based on the first user input, wherein the custom IP is deployable to the programmable measurement device;
   wherein once the custom IP is deployed to the programmable measurement device, during operation of the host device and the programmable measurement device the custom IP communicates directly with the standard driver IP, and provides custom functionality of the programmable measurement device while preserving functionality of the standard driver IP on the programmable measurement device and the standard device driver.

2. The non-transitory computer accessible memory medium of claim 1, wherein once the custom IP is deployed to the programmable measurement device, the custom IP is executable to modify or control functionality of the standard device driver while preserving functionality of the standard driver IP on the programmable measurement device and the standard device driver.

3. The non-transitory computer accessible memory medium of claim 1, wherein the program instructions are further executable by a processor to perform:
   receiving second user input specifying a custom IP interface for the host device, wherein the host device comprises:
      the standard device driver for the programmable measurement device that is provided by the vendor of the standard device driver; and
   generating the custom IP interface based on the second user input, wherein the custom IP interface is deployable to the host device;
   wherein once deployed to the host device, during operation of the host device and the programmable measurement device, the custom IP interface communicates directly with a user application executing on the host device and the custom IP, wherein the custom IP interface provides an interface between the user application and the custom IP independent of the standard device driver and the standard driver IP while preserving functionality of the standard driver IP on the programmable measurement device and the standard device driver.

4. The non-transitory computer accessible memory medium of claim 3, wherein the second user input specifying a custom IP interface comprises one or more of:
   user input defining functionality of the custom IP interface; or
   user input selecting the custom IP interface from a set of predefined custom IP interfaces.

5. The non-transitory computer accessible memory medium of claim 3, wherein once deployed to the host device, during operation of the host device and the programmable measurement device, the custom IP interface further communicates directly with the standard device driver while preserving functionality of the standard driver IP on the programmable measurement device and the standard device driver.

6. The non-transitory computer accessible memory medium of claim 1, wherein the program instructions are further executable to perform:
   receiving user input specifying the user application; and
   generating the user application based on the user input specifying the user application.

7. The non-transitory computer accessible memory medium of claim 1, said generating the custom IP comprises:
   generating a hardware configuration program based on the specified functionality, wherein the hardware configuration program implements the custom IP, and wherein the custom IP is deployable to the programmable measurement device by deploying the hardware configuration program to the programmable measurement device.

8. The non-transitory computer accessible memory medium of claim 1, wherein the first user input specifying custom IP comprises one or more of:
   user input defining functionality of the custom IP; or
   user input selecting the custom IP from a set of predefined custom IPs.

9. The non-transitory computer accessible memory medium of claim 1, wherein the programmable measurement device comprises a radio frequency (RF) device.

10. The non-transitory computer accessible memory medium of claim 1, wherein the programmable measurement device is configured to perform one or more of:
   data acquisition;
   data/signal stimulus generation;
   process or system monitoring;
   data/signal measurement;
   data/signal processing or analysis; or
   process or system control.

11. The non-transitory computer accessible memory medium of claim 1, wherein the program instructions implement a high-level design tool that is executable to perform said receiving first user input and said generating the custom IP.

12. The non-transitory computer accessible memory medium of claim 1, wherein the custom IP is configured to provide alternate implementations of standard functionality provided by the standard driver IP and standard device driver.

13. The non-transitory computer accessible memory medium of claim 1, wherein the custom IP is configured to perform device state manipulation of the programmable measurement device.

14. The non-transitory computer accessible memory medium of claim 1, wherein the custom IP is configured to perform data reduction on data received by the programmable measurement device, thereby reducing the amount of data provided to the standard driver IP for provision to the standard device driver.

15. The non-transitory computer accessible memory medium of claim 1, wherein the programmable measurement device is configured to couple to one or more external devices, wherein the programmable measurement device and the one or more external devices comprise a multi-device system, and wherein the custom IP is configured to perform multi-device orchestration of the multi-device system.

16. The non-transitory computer accessible memory medium of claim 1, wherein the programmable measurement device is configured to perform closed loop processing and control, and wherein to perform closed loop processing and control, the programmable measurement device is configured to:
   receive data from the standard driver IP;
   process the data from the standard driver IP, thereby generating processed data; and
   provide the processed data to the standard driver IP.

17. A system, comprising:
   a programmable measurement device, comprising:
      standard driver IP provided by a vendor of the programmable measurement device, wherein the standard driver IP is configured to operate in conjunction with a standard device driver for the programmable measurement device that is provided by a vendor of the standard device driver and is resident on a host device; and
      a programmable hardware element, configured with custom IP;
   wherein, during operation of the host device and the programmable measurement device:
      the custom IP communicates directly with the standard driver IP and provides custom functionality of the programmable measurement device while preserving functionality of the standard driver IP on the programmable measurement device and the standard device driver.

18. The system of claim 17, further comprising:
   the host device, coupled to the programmable measurement device, the host device comprising:
      the standard device driver for the programmable measurement device that is provided by the vendor of the standard device driver;
      a user application; and
      a custom IP interface, executable by the host device;
   wherein, during operation of the host device and the programmable measurement device:
      the custom IP further communicates directly with the custom IP interface; and
      the custom IP interface communicates directly with the user application executing on the host device and the custom IP, wherein the custom IP interface provides an interface between the user application and the custom IP independent of the standard device driver and the standard driver IP while preserving functionality of the standard driver IP on the programmable measurement device and the standard device driver.

19. A computer-implemented method, comprising:
   utilizing a computer to perform:
      receiving user input specifying functionality of custom IP for a programmable measurement device, wherein the programmable measurement device includes:
         a programmable hardware element; and
         standard driver IP provided by a vendor of the programmable measurement device, wherein the standard driver IP is configured to operate in conjunction with a standard device driver for the programmable measurement device that is provided by a vendor of the standard device driver and is resident on a host device configured to couple to the programmable measurement device for operation of the programmable measurement device; and
      generating the custom IP based on the specified functionality, wherein the custom IP is deployable to the programmable measurement device, thereby configuring the programmable measurement device such that:
         during operation of the host device and the programmable measurement device the custom IP communicates directly with the standard driver IP and provides custom functionality of the programmable measurement device while preserving functionality of the standard driver IP on the programmable measurement device and the standard device driver.

20. The method of claim 19, further comprising:
   receiving user input specifying functionality of a custom IP interface for the host device, wherein the host device comprises:

the standard device driver for the programmable measurement device that is provided by the vendor of the standard device driver; and generating the custom IP interface, wherein the custom IP interface is deployable to the host device, thereby configuring the host device such that:

during operation of the host device and the programmable measurement device, the custom IP interface communicates directly with a user application executing on the host device and the custom IP, wherein the custom IP interface provides an interface between the user application and the custom IP independent of the standard device driver and the standard driver IP while preserving functionality of the standard driver IP on the programmable measurement device and the standard device driver.

\* \* \* \* \*